(12) United States Patent
Fu et al.

(10) Patent No.: US 6,426,649 B1
(45) Date of Patent: Jul. 30, 2002

(54) ARCHITECTURE FOR FIELD PROGRAMMABLE GATE ARRAY

(75) Inventors: Robert Fu, Cupertino; David D. Eaton; Kevin K. Yee, both of San Jose; Andrew K. Chan, Palo Alto, all of CA (US)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 09/751,440

(22) Filed: Dec. 29, 2000

(51) Int. Cl.[7] .............................................. H03K 7/38
(52) U.S. Cl. ............................ 326/41; 326/40; 326/39; 326/38; 326/86; 327/293; 327/292
(58) Field of Search ................................ 326/38–41, 83, 326/86, 56–58; 327/293, 292, 565

(56) References Cited

U.S. PATENT DOCUMENTS

| | | | | |
|---|---|---|---|---|
| 5,594,367 A | * | 1/1997 | Trimberger et al. ............ | 326/41 |
| 5,682,106 A | * | 10/1997 | Cox et al. ....................... | 326/39 |
| 5,958,026 A | * | 9/1999 | Goetting et al. ............... | 710/52 |
| 6,028,444 A | * | 2/2000 | Wong et al. .................... | 326/38 |
| 6,107,826 A | * | 8/2000 | Young et al. ................... | 326/41 |
| 6,208,162 B1 | * | 3/2001 | Bocchino ....................... | 326/38 |
| 6,218,859 B1 | * | 4/2001 | Pedersen ........................ | 326/39 |
| 6,236,229 B1 | * | 5/2001 | Or-Bach ......................... | 326/39 |
| 6,242,945 B1 | * | 6/2001 | New ............................... | 326/39 |
| 6,252,419 B1 | * | 6/2001 | Sung et al. ..................... | 326/38 |

* cited by examiner

Primary Examiner—Michael Tokar
Assistant Examiner—Vibol Tan
(74) Attorney, Agent, or Firm—Skjerven Morrill LLP

(57) ABSTRACT

A field programmable gate array includes a programmable interconnect structure and plurality of logic cells. The logic cells each include a number of combinatorial logic circuits, which have direct interconnections with the programmable interconnect structure, and a plurality of sequential logic element, such as D type flip-flops that acts as registers. The combinatorial logic circuits may be directly connected to the programmable interconnect structure as well as connected to the input terminals of the sequential logic elements. Consequently, the logic cells include both combinatorial and registered connections with the programmable interconnect structure. Moreover, one of the sequential elements may selectively receive a dedicated input from the programmable interconnect structure. The output leads of the logic cell is connected to the programmable interconnect structure through a driver that includes a protection transistor. The gate of the protection transistor is coupled to a primary charge pump that is shared with multiple drivers as well as a secondary charge pump associated with the driver.

85 Claims, 33 Drawing Sheets

Microfiche Appendix Included
(5 Microfiche, 431 Pages)

| 3A-1 | 3B-1 | 3C-1 |
|------|------|------|
| 3A-2 | 3B-2 | 3C-2 |

*FIG. 3*

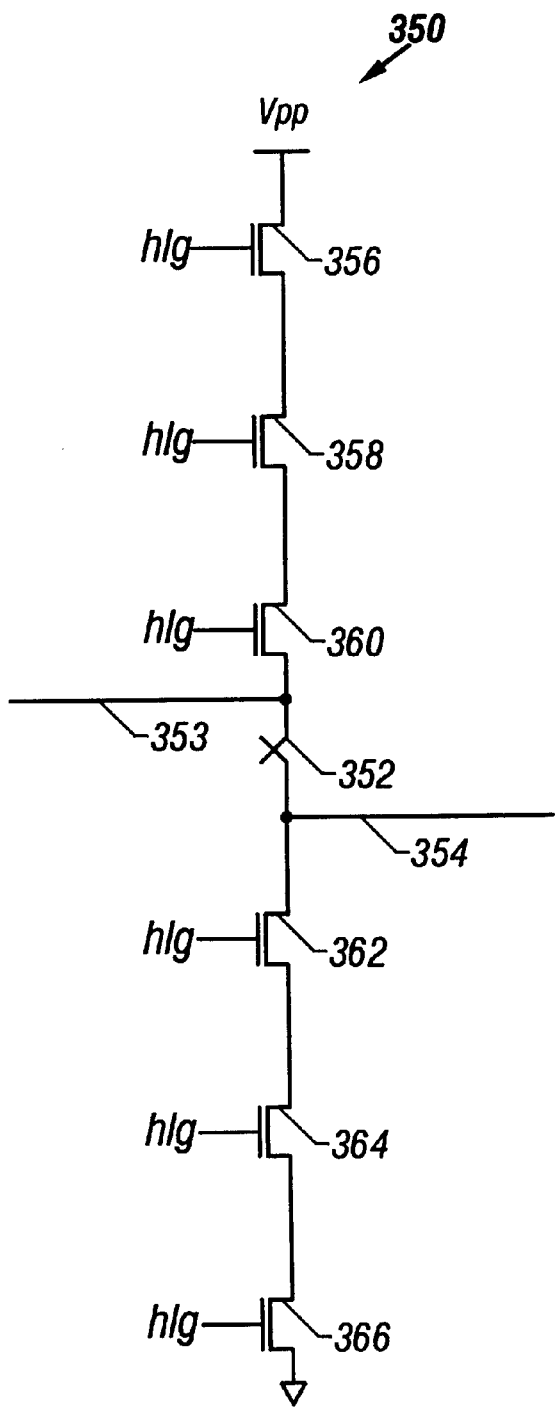
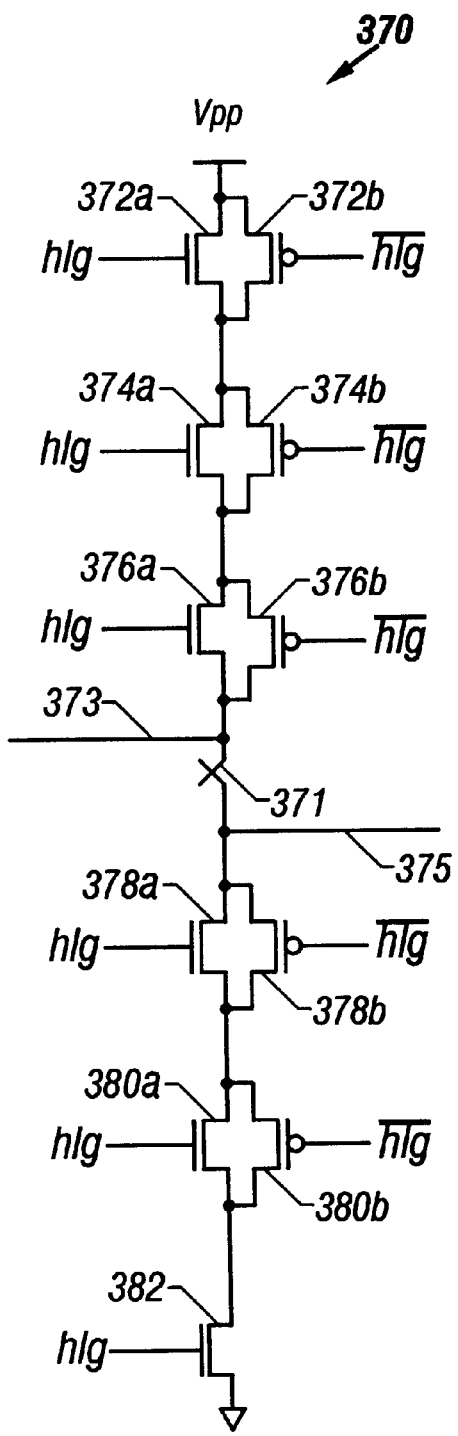
FIG. 17    FIG. 18

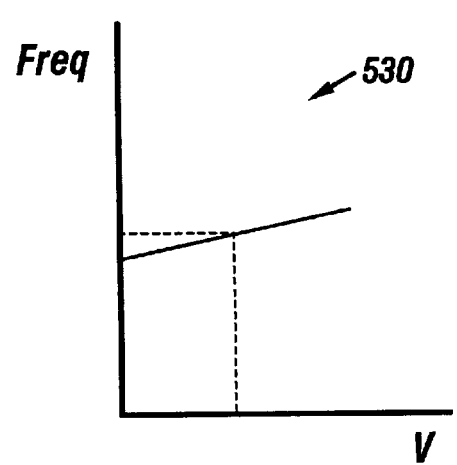
FIG. 25
*(Conventional)*

| FIG. 26A | FIG. 26B |

FIG. 26

ARCHITECTURE FOR FIELD PROGRAMMABLE GATE ARRAY

A microfiche appendix, which is part of the present disclosure, consists of 5 sheets of microfiche having a total of 431 frames. A paper appendix, which is part of the present disclosure, consists of one page. A portion of the disclosure of this patent document contains material that is subject to copyright protection. The copyright owner has no objection to the facsimile reproduction by anyone of the patent documents or patent disclosure, as it appears in the Patent and Trademark Office patent files or records, but otherwise reserves all copyright rights.

FIELD OF THE INVENTION

This invention relates to programmable integrated circuits. More particularly, this invention relates to field programmable gate arrays (FPGAs) employing, e.g., antifuses.

BACKGROUND INFORMATION

A programmable application specific integrated circuit (ASIC) is a versatile integrated circuit chip, the internal circuitry of which may be configured by an individual user to realize a user-specific circuit. To configure a programmable ASIC, the user configures an on-chip interconnect structure of the programmable ASIC so that selected input terminals and selected output terminals of selected on-chip circuit components are electrically connected together in such a way that the resulting circuit is the user-specific circuit desired by the user. In a programmable ASIC employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable application specific integrated circuit. For background information on field programmable gate arrays employing antifuses, see: "Field Programmable Gate Array Technology" edited by Stephen Trimberger, 1994, pages 1–14 and 98–170; "Field-Programmable Gate Arrays" by Stephen Brown et al., 1992, pages 1–43 and 88–202; "Practical Design Using Programmable Logic" by David Pellerin and Michael Holley, 1991, pages 84–98; the 1995 Quick-Logic Data Book, 1995, pages 1–5 through 2–11 and 6–3 through 6–18; the 1995 Actel FPGA Data Book And Design Guide, 1995, pages ix–xv, 1–5 through 1–34, 1–51 through 1–101, 1–153 through 1–222, and 3–1 through 4–56; U.S. Pat. No. 5,424,655 entitled "Programmable Application Specific Integrated Circuit Employing Antifuses And Methods Therefor"; U.S. Pat. No. 5,825,201 entitled "Programming Architecture for a Programmable Integrated Circuit Employing Antifuses." The contents of these documents are incorporated herein by reference.

SUMMARY

A programmable integrated circuit, such as a field programmable gate array that employs antifuses, includes a programmable interconnect structure and plurality of logic cells. The logic cells each include a number of combinatorial logic circuits, which have direct interconnections with the programmable interconnect structure, and a plurality of sequential logic element, such as D type flip-flops that act as registers. The combinatorial logic circuits may be directly connected to the programmable interconnect structure as well as connected to the input terminals of the sequential logic elements. The output terminal of one combinatorial logic circuit may be selectively coupled a plurality of the sequential logic elements as well as to directly connected to the programmable interconnect structure. Consequently, the logic cells include both combinatorial and registered connections with the programmable interconnect structure. Moreover, one of the sequential elements may selectively receive a dedicated input from the programmable interconnect structure.

In addition, the output leads of the logic cells are connected to the programmable interconnect structure through a driver that includes a protection transistor. The gate of the protection transistor is coupled to a primary charge pump, which is shared with multiple drivers. In addition, the gate of the protection transistor is coupled to a secondary charge pump that is associated with the driver.

Another aspect of the present invention is directed to a programmable device with an input/output (I/O) circuit that includes an output register coupled to the programmable interconnect structure that feeds back into the programmable interconnect structure. The I/O circuit may also include an output register and an output enable register. Where the I/O circuit includes an input register, an output register and an output enable register, a boundary scan circuitry may use the input register, an output register, and an output enable register as boundary scan registers. I/O control pads may be coupled directly to the I/O circuit, e.g., the input register, output register and the output enable register. The I/O control pads are coupled to a data terminal of a multiplexer, while the other data terminal of the multiplexer is coupled to the programmable interconnect structure. The output terminal of the multiplexer is coupled to both the programmable interconnect structure and the I/O circuit. The output register is coupled to an I/O pad through a buffer, which is controlled by the output enable register. The I/O circuit may also include a buffer with an adjustable slew rate. The buffer includes an inverter that is coupled to ground through a resistive element and through a transistor that is in parallel with the resistive element. The adjustable slew rate is controlled, e.g., by enabling or disabling the transistor that couples the inverter. Likewise, an inverter may be coupled to a voltage potential through a resistive element and another transistor that is in parallel with the resistive element. The input register may be coupled to the I/O pad through a differential translator. The differential translator, e.g., includes an input terminal that may be coupled to different voltage reference sources.

Another aspect of the present invention is directed to an FPGA with an array of logic cells that are divided into quadrant and a clock network that extends into the approximate center of each quadrant and bisects each quadrant. The clock network includes a primary clock bus that is coupled to the I/O pad, e.g., via another bus that bisects the primary clock bus, and extends horizontally between the quadrants. A plurality of second clock buses extends vertically from the primary bus into each quadrant. The clock network includes a plurality of third clock buses, each of which is coupled to one of the second clock buses and bisects a quadrant. Clock buses extend vertically, both upward and downward, from each of the third clock buses and are programmably coupled to the logic cells. The clock network may be used, e.g., to distribute a dedicated clock signal to the logic cells. In addition, a programmable phase locked loop may be used with the clock network. The phase locked loop includes a programmable divide by n circuit before the phase detector and in the feedback loop, which permits programmable control over the delay. In addition, the phase locked loop includes a programmable divide by n circuit after the voltage controlled oscillator (VCO) which advantageously extends the range of the VCO.

Another aspect of the present invention is directed to the programming architecture in an FPGA, wherein the logic cells and routing resources are divided into subsections, e.g., quadrants, with a different set of vertical programming cells and horizontal programming cells coupled to each subsection. The FPGA includes a plurality of power buses, e.g., eight, where a different set of power buses, e.g., four power buses, is coupled to each horizontal and vertical programming cells. Each set of power buses coupled to the horizontal programming cells includes at least one different power bus. The horizontal and vertical programming cells approximately bisect each subsection. Thus, the distance from the programming cells to any antifuse within a subsection is minimized. Each set of programming cells provides a subset of the power buses in one direction and another subset in the opposite direction. Thus, the FPGA includes an eight bit programming architecture.

In another aspect of the present invention, a CMOS architecture is used to program the antifuses within the FPGA. Thus, the FPGA includes at least one antifuse, a high voltage programming source switchably coupled to said antifuse and a low voltage programming source switchably coupled to said antifuse. An NMOS transistor is disposed between the high voltage programming source and the antifuse and a PMOS transistor is in parallel with the NMOS transistor. A plurality of NMOS transistors and parallel PMOS transistors may be coupled in series between the high voltage programming source and the antifuse. Likewise, an NMOS transistor is disposed between the low voltage programming source and the antifuse and a PMOS transistor is in parallel with that NMOS transistor. A control circuit provides appropriate gate voltages to the NMOS transistor and PMOS transistor to turn the transistors on and off substantially simultaneously. The use of CMOS architecture advantageously permits the gate voltage of the NMOS transistor to be approximately the same as the voltage provided by the high voltage programming source. Consequently, no charge pump is required.

This summary does not purport to define the invention. The invention is defined by the claims.

BRIEF DESCRIPTION OF THE DRAWINGS

Figure 3:
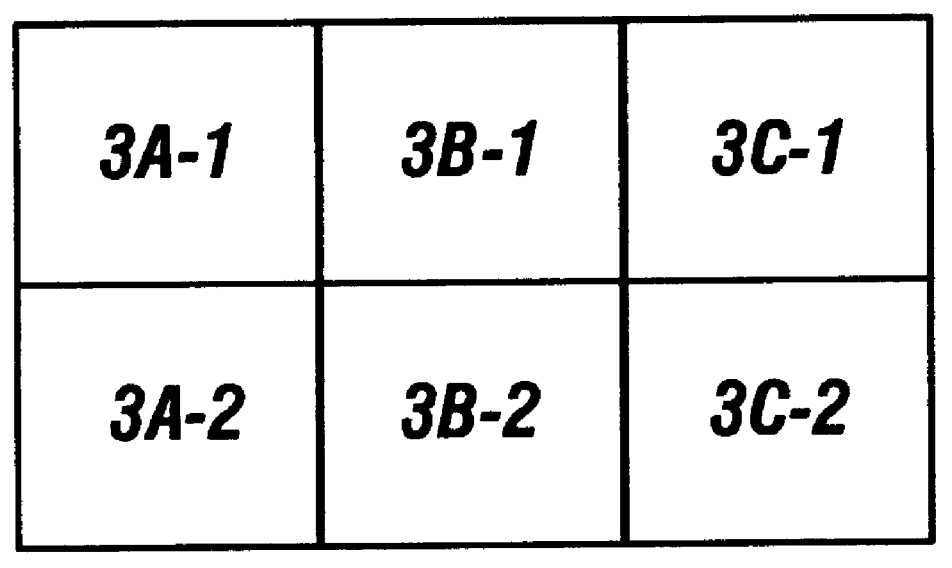

FIG. 3, which includes FIGS. 3A-1, 3A-2, 3B-1, 3B-2, 3C-1 and 3C-2, is an example of the macrocells in FIGS. 1 and 2.

FIG. 17 shows a conventional programming architecture used to program an antifuse.

FIG. 18 shows a programming architecture used to program an antifuse in accordance with an embodiment of the present invention.

FIG. 25 is a graph of the voltage versus frequency illustrating a conventional range for a VCO.

FIG. 26, which includes

DETAILED DESCRIPTION

Figure 1:
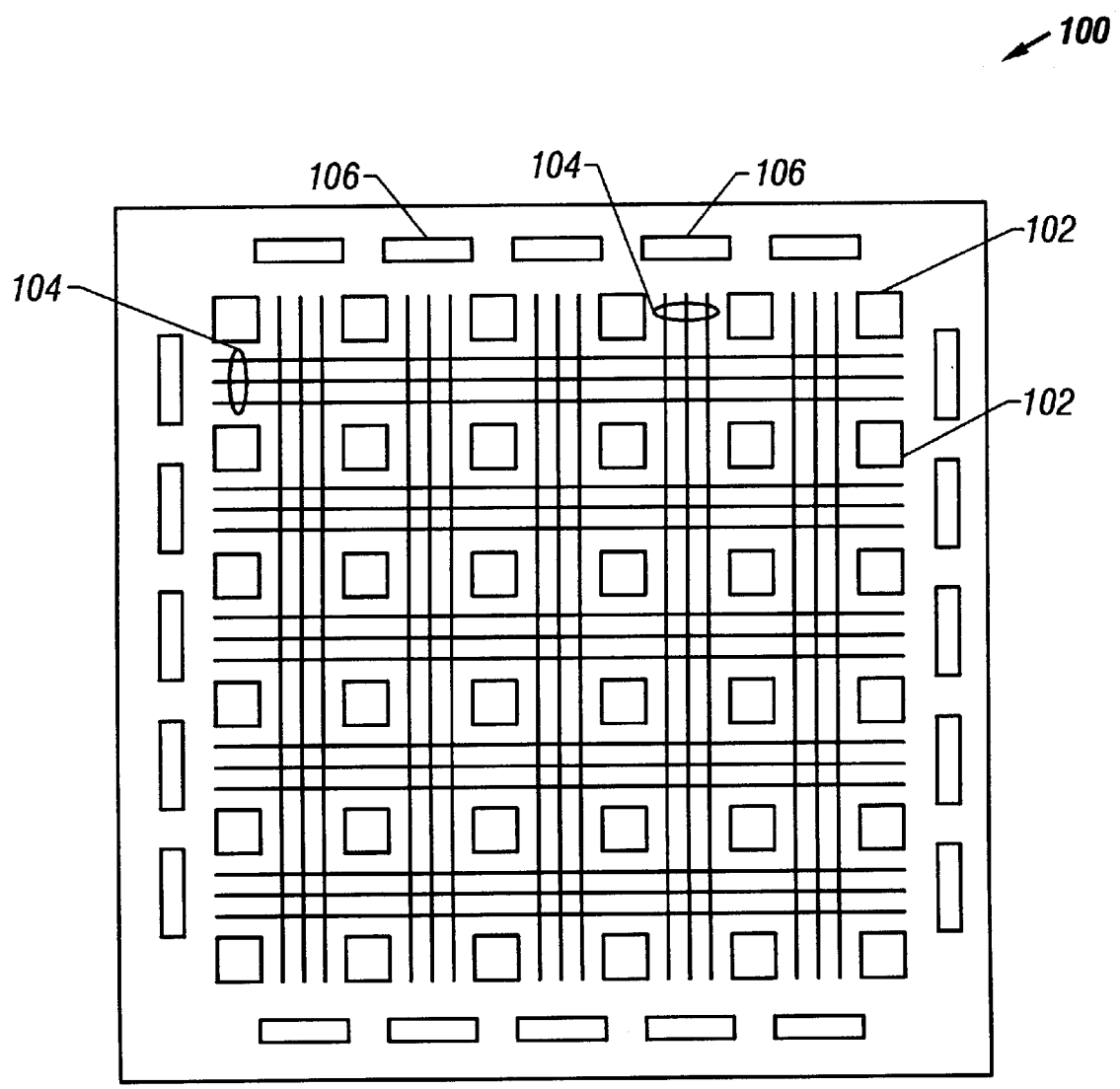
FIG. 1 shows a schematic view of a programmable device, such as a field programmable gate array (FPGA).

FIG. 1 shows a schematic view of a programmable device 100, such as a field programmable gate array (FPGA). Programmable device 100 is shown with six rows and six columns of macrocells 102 and a plurality of interconnecting routing resources 104, shown schematically as horizontal and vertical lines. Programmable device 100 may have more or fewer macrocells than shown in FIG. 1. A plurality of input/output ("I/O") cells 106 is also shown in FIG. 1. Routing resources 104 are populated with programmable elements, such as antifuses (not shown) that may be programmed to interconnect desired macrocells 102 and I/O blocks 106 in various configurations as desired by the user.

To configure a programmable device, the user configures the interconnect structures, i.e., routing resources 104 and antifuses (not shown) disposed between various routing resources so that selected input terminals and selected output terminals of selected on-chip circuit components, e.g., macrocells 102 and I/O cell 106, are electrically connected together in such a way that the resulting circuit is the specific circuit desired by the user. In a programmable device employing, for example, amorphous silicon antifuses, selected antifuses disposed between selected wire segments are "programmed" to connect the selected wire segments together electrically.

Figure 2:
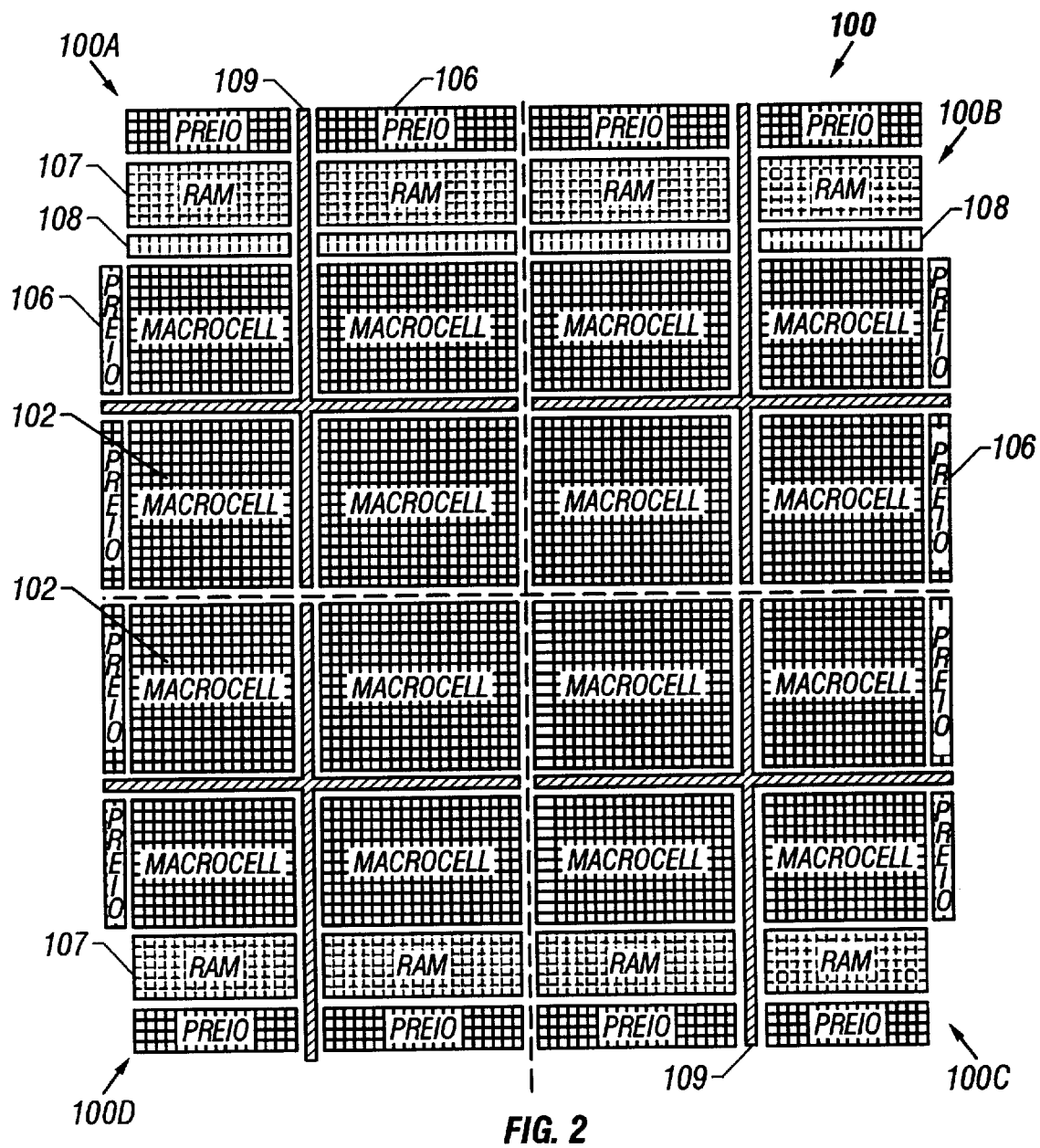
FIG. 2 is another view of an FPGA including a plurality of macrocells and I/O cells.
Figures 1, 3A:
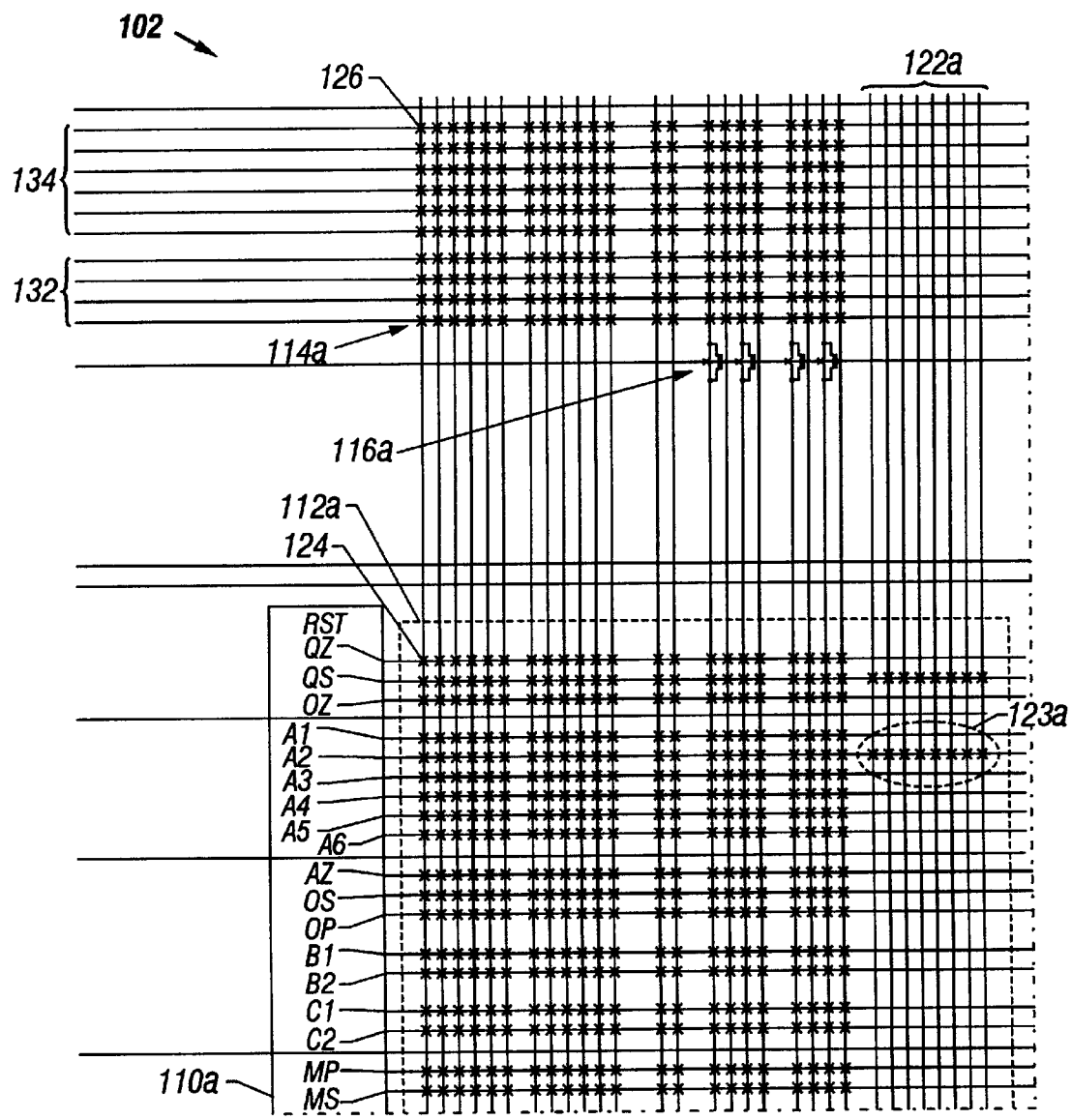
Figures 2, 3A:
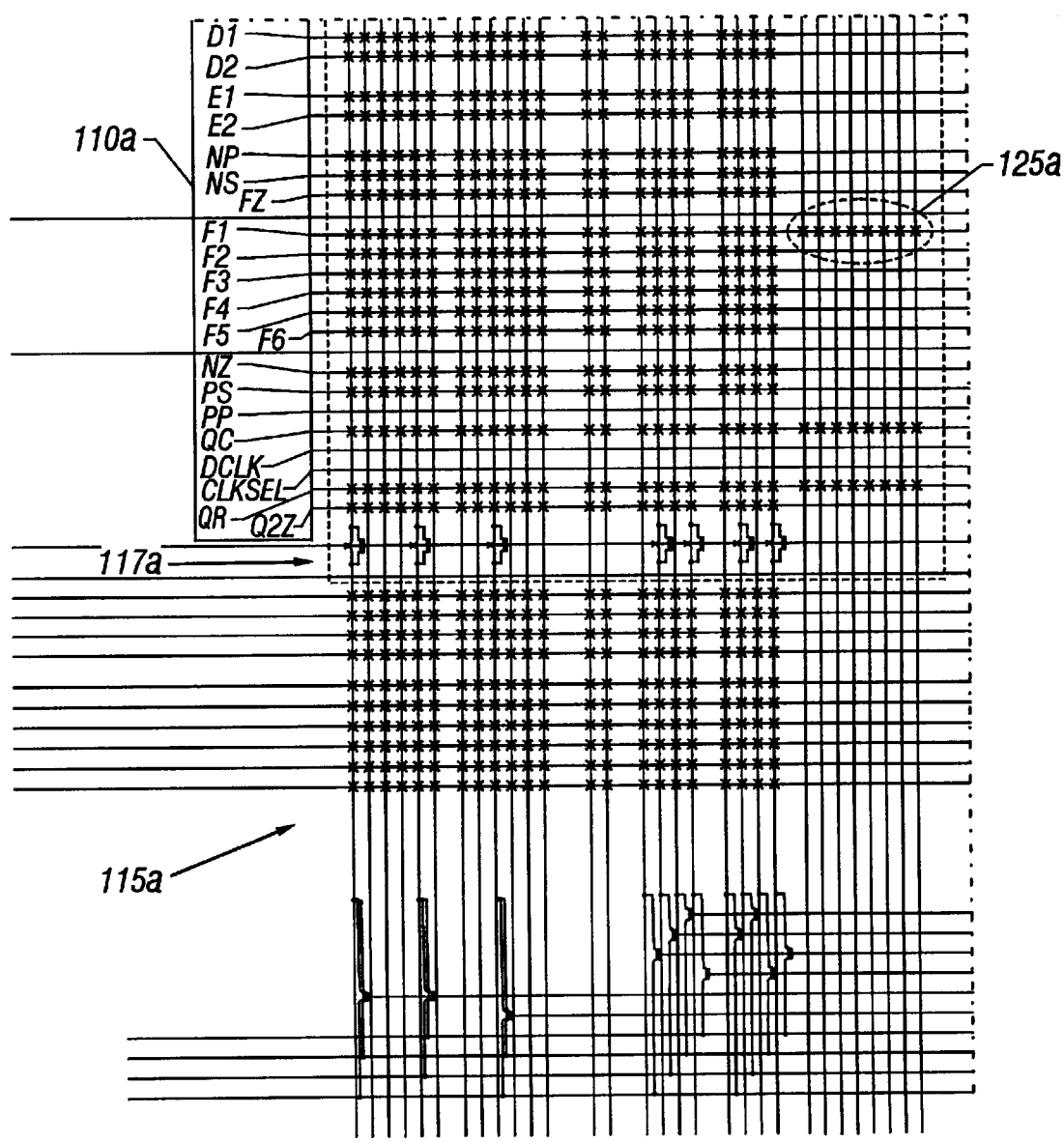
Figures 1, 3B:
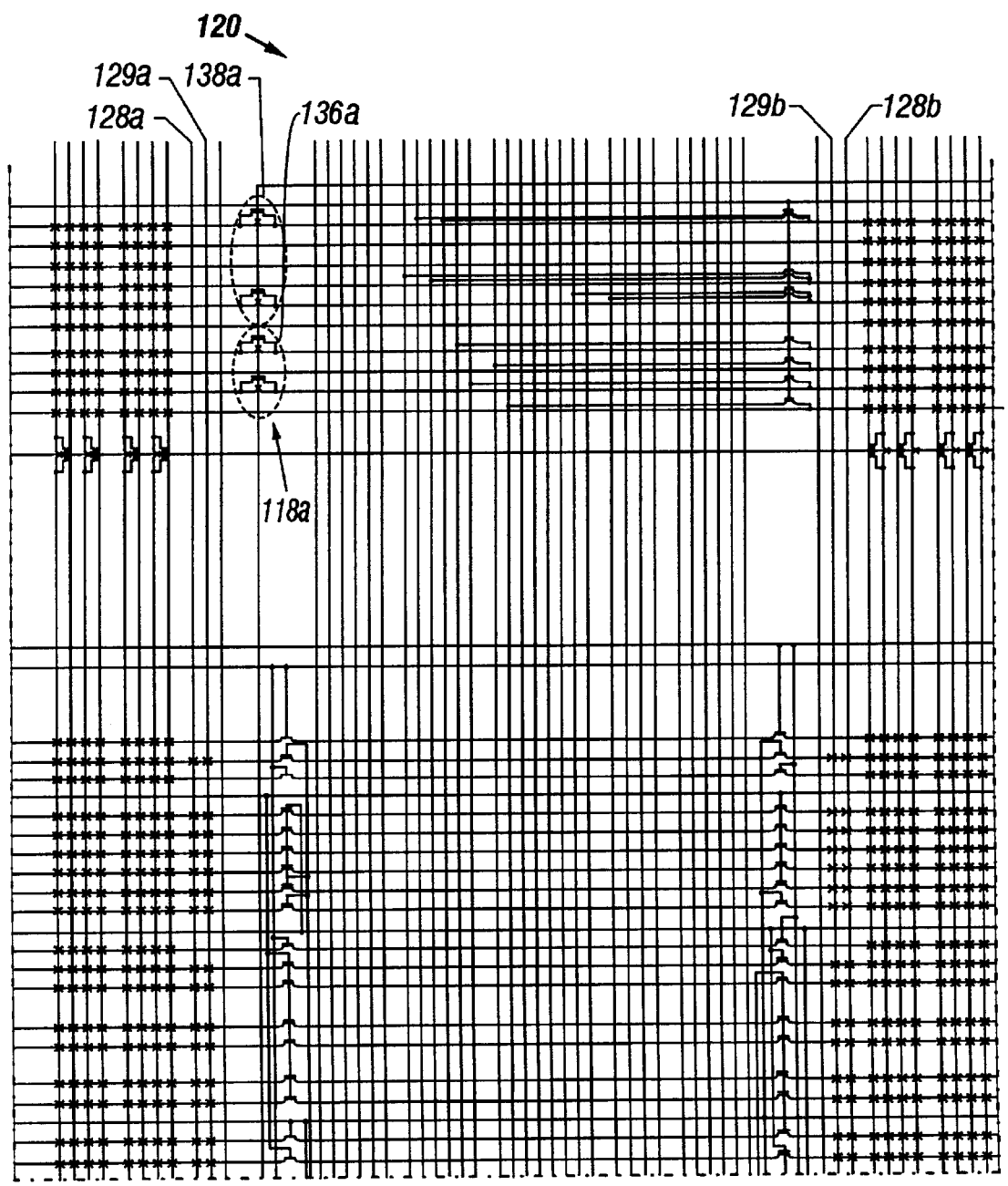
Figures 2, 3B:
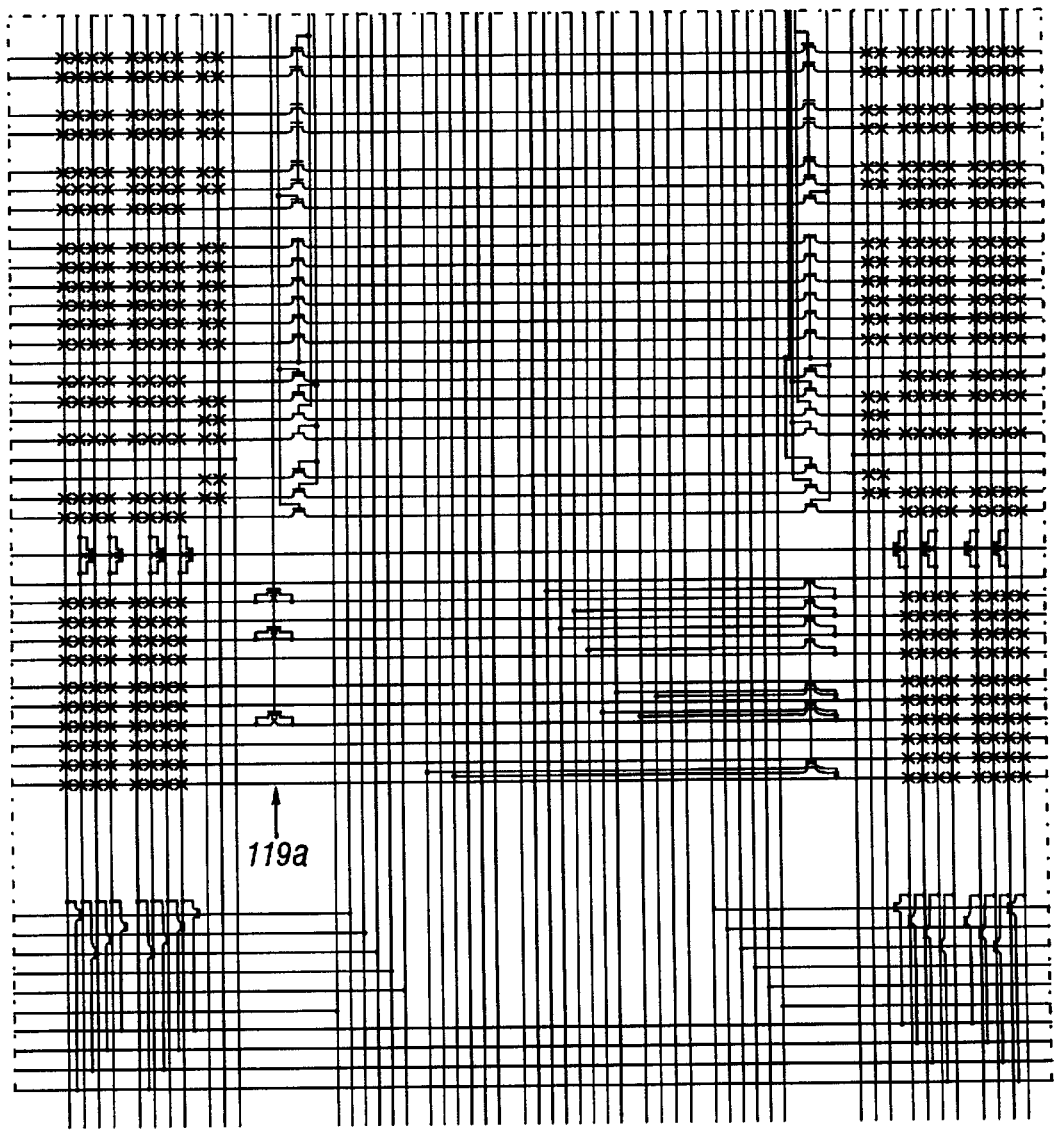
Figures 1, 3C:
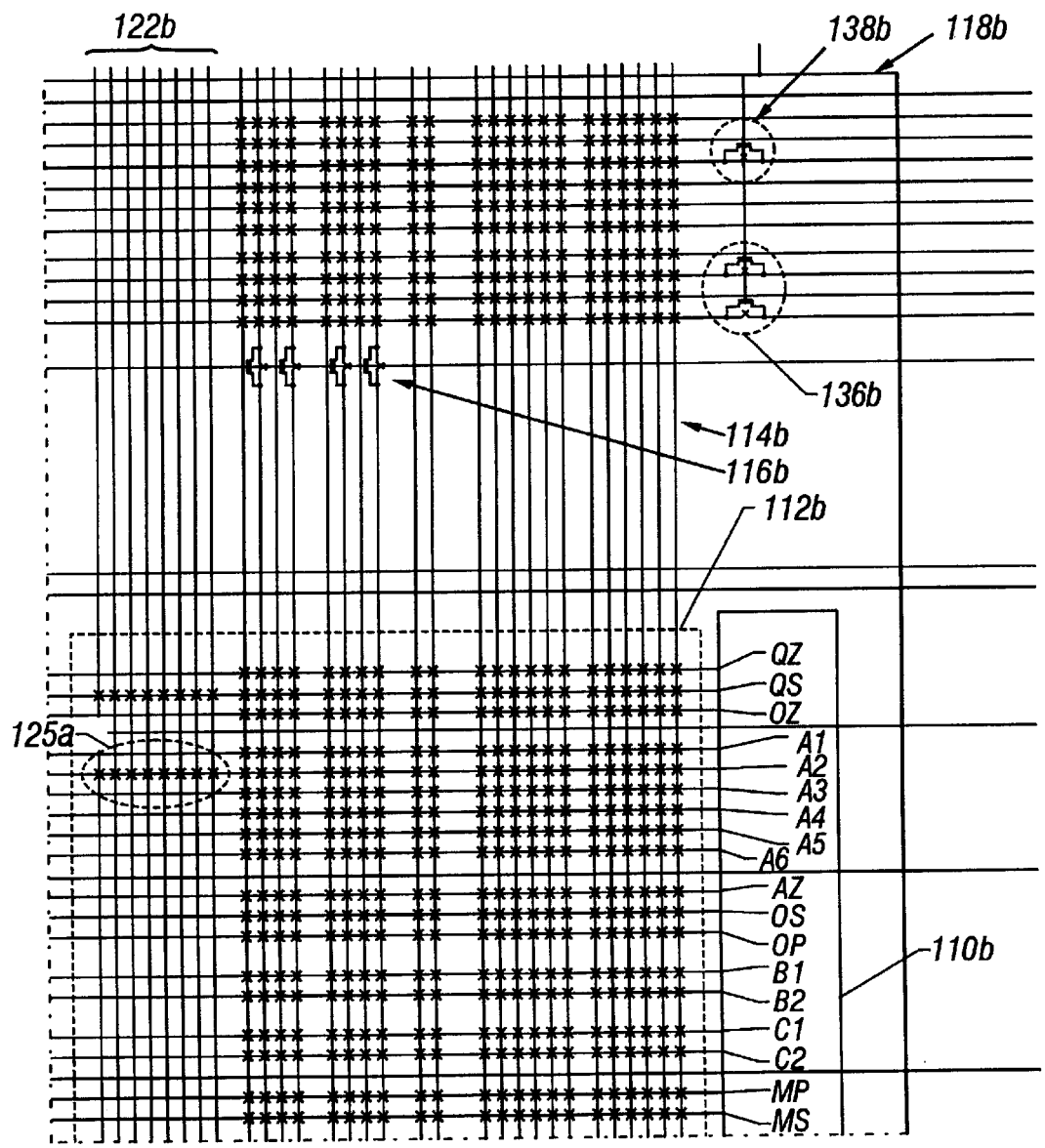
Figures 2, 3C:
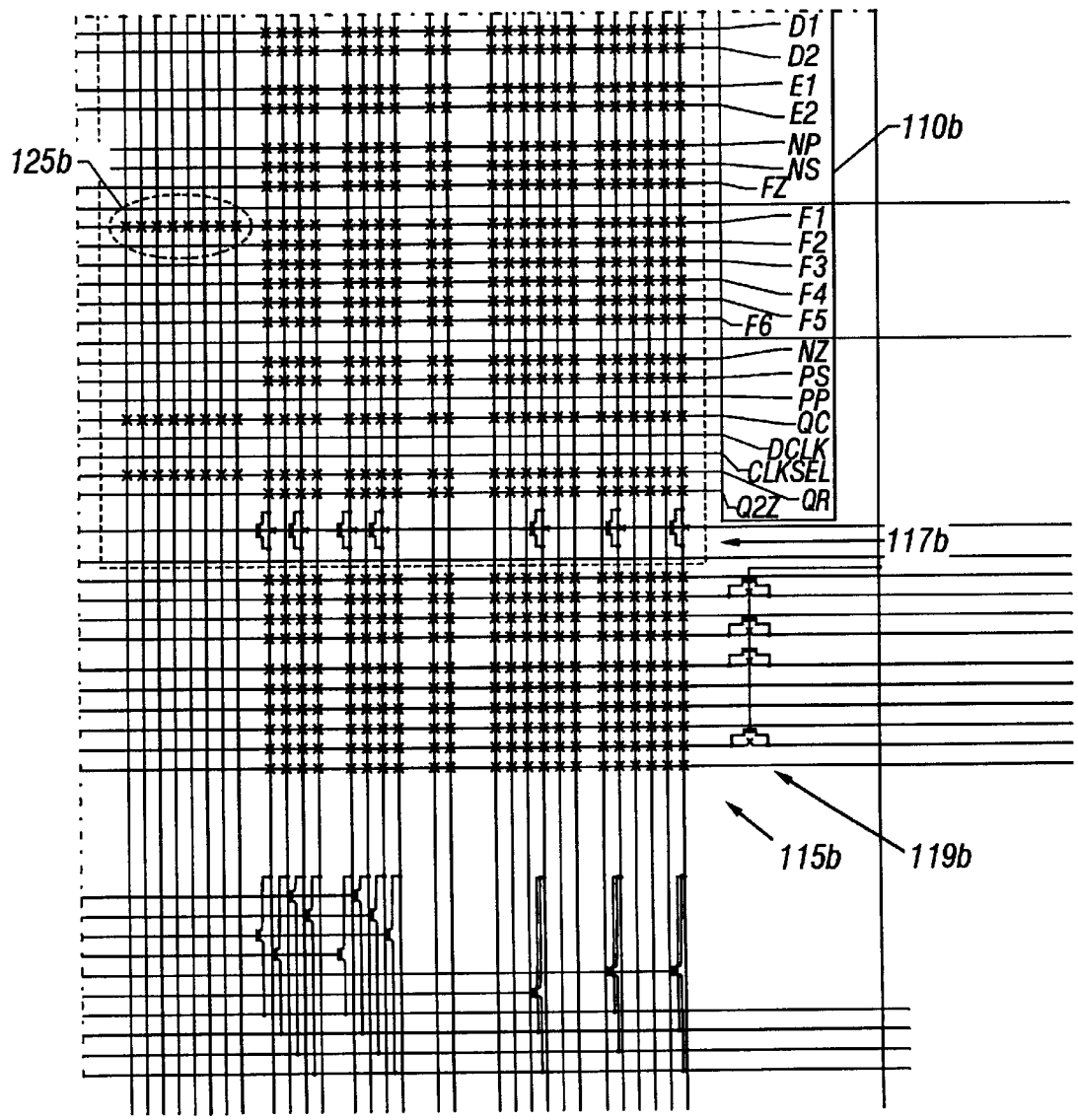

FIG. 2 is another schematic view of FPGA 100, including a plurality of macrocells 102 and I/O cells 106, referred to in FIG. 2 as PREIO blocks. Each square in FIG. 2 represents, for example one macrocell or one I/O circuit. The routing resources are not shown in FIG. 2, for the sake of clarity. As shown in FIG. 2, if desired, FPGA 100 may include embedded circuitry such as RAM 107 and/or additional embedded circuit 108, which may perform any desired function. The RAM 107 and/or embedded circuit 108 may be a non-programmable or partially programmable application specific integrated circuit (ASIC) design. For more information on embedded circuits, such as RAM 107 and embedded circuit 108, see, e.g., U.S. Ser. No. 09/650,773, entitled "Integrated Circuit Including Dedicated And Programmable Logic", and U.S. Ser. No. 09/345,663, entitled "Ram with Configurable Depth and Width" and U.S. Ser. No. 09/451,681, entitled "Programmable Device With An Embedded Portion For Receiving A Standard Circuit Design", all of which are incorporated herein by reference. The embedded circuit 108 may be, e.g., a configurable computational unit, such as that described in the co-filed and co-pending U.S. patent application entitled "Configurable Computational Unit Embedded In A Programmable Device" by Brian C. Faith et al., having Ser. No. 09/751,538, which has the same assignee as the present disclosure and is herein incorporated by reference.

Also shown in FIG. 2, are horizontal and vertical programming shift registers 109, a pair of which are located in each quadrant 100A, 100B, 100C, and 100D of FPGA 100. The shift registers 109 are used in programming the desired interconnections within FPGA 100, which will be described in more detail below.

Field programmable gate arrays and programming methodologies are described in general, for example, in U.S. Pat. No. 5,825,201 entitled "Programming Architecture for a Programmable Integrated Circuit Employing Antifuses" and U.S. Pat. No. 5,327,024, entitled "Field Programmable Antifuse Device and Programming Method Therefor," which are incorporated herein by reference.

Various aspects of the FPGA 100 of FIGS. 1 and 2 are set forth below in further detail. The microfiche appendix includes a complete hierarchical schematic (including test circuitry) of the FPGA 100 of FIGS. 1 and 2.

Macrocell 102 is a repeated portion of FPGA 100 and includes at least one module of logic elements and a portion of the programmable interconnect and programming structure. FIG. 3, which includes FIGS. 3A, 3B, and 3C, as indicated by the key of FIG. 3, is an example of macrocell 102. As shown in FIG. 3, macrocell 102 includes two logic cells 110a and 110b and logic cell interconnect sections 112a and 112b. The routing network in macrocell 102 generally comprises illustrative substantially identical switch sections 114a, 114b and 115a, 115b, illustrative substantially identical vertical pass link sections 116a, 116b and 117a, 117b, and illustrative substantially identical horizontal pass link sections 118a, 118b, and 119a, 119b. Macrocell 102 also includes a programming section 120 as well as clock buses 122a and 122b. As can be seen in FIG. 3, the logic cells 110a and 110b and their respective logic cell interconnect sections 112a and 112b and supporting routing network is substantially mirror image. Moreover, the routing resources above and below logic cells 110a and 110b are substantially mirror images.

In general, in the logic cell interconnect sections 112a and 112b, each crossing of a vertical wire and a horizontal wire from an input or output terminal of the logic cell 110a or 110b is linked by cross links such as antifuse 124. Likewise, in the illustrative switch sections 114a, 114b, 115a, and 115b, generally each crossing of a vertical wire and a horizontal wire is linked by a cross link such as antifuse 126.

Contrary to the general arrangement of antifuses, the vertical wires 128a, 128b and 129a, 129b are not provided with antifuses to all of the horizontal wires as wires 128a, 128b (tiehi) are coupled to power buses and wires 129a and 129b (tielo) are coupled to ground buses. Ground and power are not applied to the output nodes of the logic cells and therefore no antifuses are provided in the logic cell link sections between the vertical wires 128a, 128b and 129a, 129b and the output wires of the logic cells 110a and 110b.

Routing resources, e.g., switch section 114a, includes two sets of wires: dual lines 132 and quad lines 134. Dual lines 132 include pass links 136a and 136b between every two logic cells. As shown in FIG. 3, the pass links 136a and 136b are staggered, with two pass links 136a linking two of the dual lines 132 to the right of logic cell 110a, and two pass links 136b linking the other two of the dual line 132 to the right of logic cell 110b. Quad lines 134 are similar to dual lines 132, but include pass links 138a and 138b between every four logic cells. As shown in FIG. 3, there are six quad lines 134, three of which include staggered pass links 138a and 138b. Another macrocell (not shown) to the right or left of macrocell 102, will be substantially similar to macrocell 102, but will have pass links for the remaining three of the six quad lines 134.

As a general rule, the cross link antifuses are programmable. In the unprogrammed state, the antifuses provide an open circuit and in a programmed state, the antifuses provide a closed circuit. A particularly suitable type of antifuse is the amorphous silicon antifuse disclosed in U.S. Pat, No. 5,502,315, entitled "Electrically Programmable Interconnect Structure a Having PECVD Amorphous Silicon Element" and U.S. Ser. No. 09/196,946, entitled "Metal-To-Metal Antifuse With Non-Conductive Diffusion Barrier" filed Nov. 19, 1998, by Shroff et al., which are hereby incorporated by reference. Other types of programmable elements, such as SRAMs, may be suitable as well, however.

Figure 4:
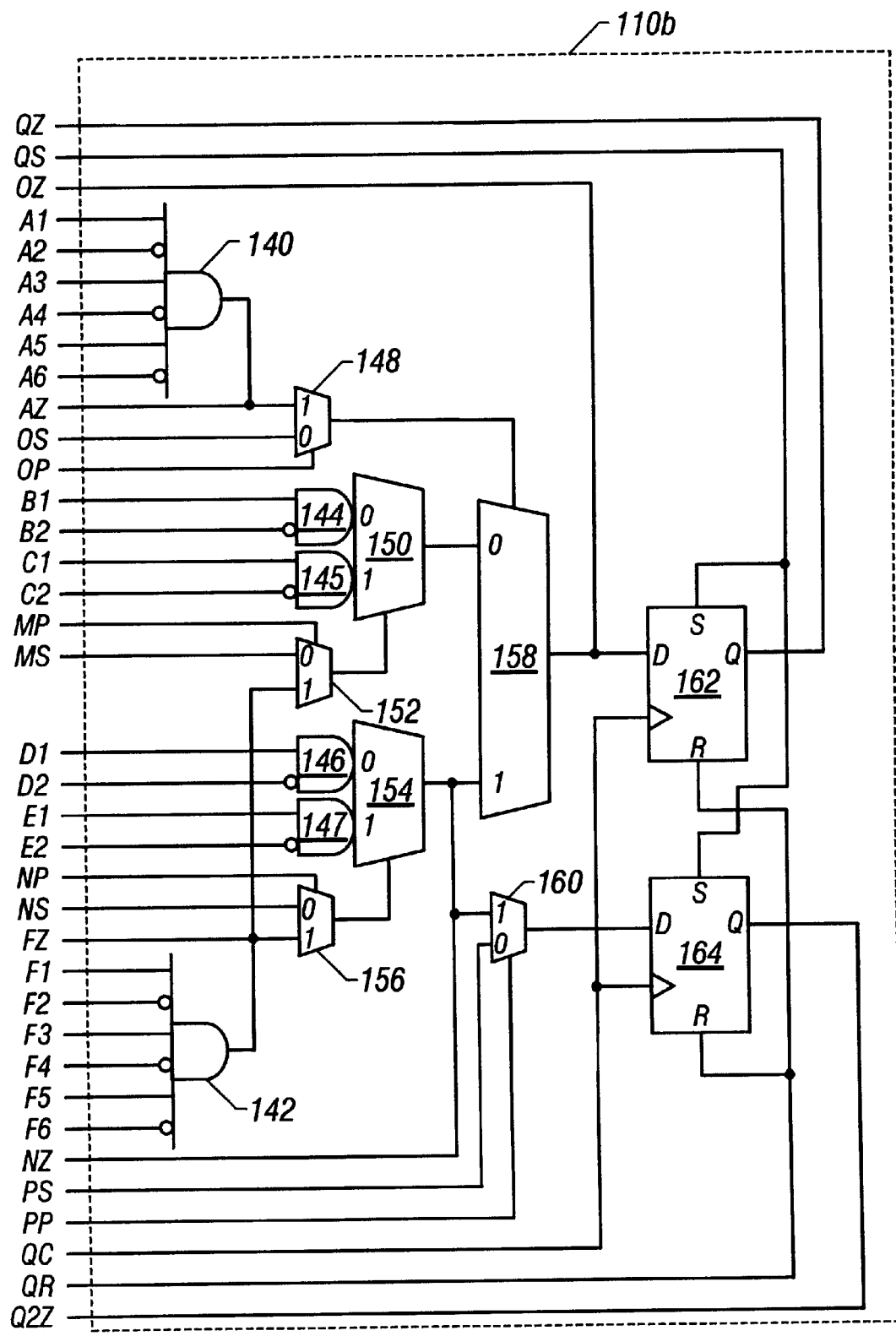
FIG. 4 is a schematic view of a single logic cell within a macrocell.

FIG. 4 is a schematic view of logic cell 110b from FIG. 3. Logic cell 102b consists of two 6-input AND gates 140 and 142, each having three true input terminals and three complement input terminals, four two-input AND gates 144–147, each with true and complement input terminals, seven two-to-one multiplexers 148, 150, 152, 154, 156, 158 and 160, and two registers 162 and 164. Logic cell 110b is similar to the logic cell disclosed, e.g., in U.S. Pat. No.

6,084,428, entitled "Programmable Integrated Circuit Having Shared Programming Conductors Between Columns of Logic Modules," issued Jul. 4, 2000, by Kolze et al., which is incorporated herein by reference, however, logic cell 110b includes two sequential logic elements in the form of delay or "D" registers 162 and 164, the outputs of which are furnished as outputs QZ and Q2Z of the logic cell 110b. Registers 162 and 164 share clock (QC), set (QS) and reset (QR) inputs. An additional multiplexer 160 is used to provide the data input to register 164, while the data input to register 162 is from multiplexer 158. Multiplexer 160 can be loaded from the NZ output from multiplexer 154, which is also an input to multiplexer 158, or may be loaded directly from a dedicated input PS, as selected by dedicated input PP.

AND gate 140 receives six inputs, three of which are true inputs A1, A3, and A5, and three of which are complement inputs A2, A4, and A6. The output terminal of AND gate 140 is an output terminal AZ of logic cell 110b and is a data input of 2:1 multiplexer 148. The other data input of multiplexer 148 is a dedicated input OS. The select terminal of multiplexer 148 is driven by dedicated input OP.

The second 6-input AND gate 142 also receives three true inputs F1, F3, and F5, and three complement inputs F2, F4, and F6. The output terminal of AND gate 142 is an output terminal FZ of logic cell 110b and is a data input of 2:1 multiplexer 152 and 2:1 multiplexer 156. The other data inputs of multiplexers 152 and 156 are dedicated inputs MS and NS, respectively. Multiplexers 152 and 156 are controlled by dedicated inputs MP and NP, respectively.

AND gate 144 receives a true input B1 and a complement input B2, and furnishes its output to a data input of 2:1 multiplexer 150. AND gate 145 receives a true input C1 and a complement input C2, and furnishes its output to the other data input of 2:1 multiplexer 150. Similarly, AND gate 146 receives a true input D1 and a complement input D2, and furnishes its output to a data input of 2:1 multiplexer 154. AND gate 147 receives a true input E1 and a complement input E2, and furnishes its output to the other data input of 2:1 multiplexer 154.

The select terminal of multiplexer 150 is driven by the output of multiplexer 152, while the select terminal of multiplexer 154 is driven by the output of multiplexer 156.

The output of multiplexers 150 and 154 are received as data inputs of 2:1 multiplexer 158. The select input of multiplexer 158 is driven by the output of multiplexer 148.

Thus, logic cell 110b has thirty-one input terminals (including register control lines) and fits a wide range of functions with up to seventeen simultaneous inputs. Logic cell 110b has six outputs, four of which are combinatorial and two are registered. The high logic capacity and fan-in of logic cell 110b accommodates many user functions with a single level of logic delay thereby resulting in high performance compared to conventional logic cells which require two or more levels of delay.

Advantageously, global clock buses may be used to drive both AND gates 140 and 142, with the clock driving a true input, e.g., A1, in AND gate 140 and a complement input, e.g., F2, in AND gate 142. As shown in FIG. 3, clock buses 122a and 122b can be connected to the A1 and F2 inputs of logic cells 110a and 110b by programming one of the antifuses in groups 123a, 123b or 125a, 125b. In order to reduce capacitance on the clock buses, the remaining input terminals of AND gates 140 and 142 are not connectable to the clock buses. Thus, logic cells 110a and 110b can perform logic functions on the true and/or the complement of the clock.

Figure 5:
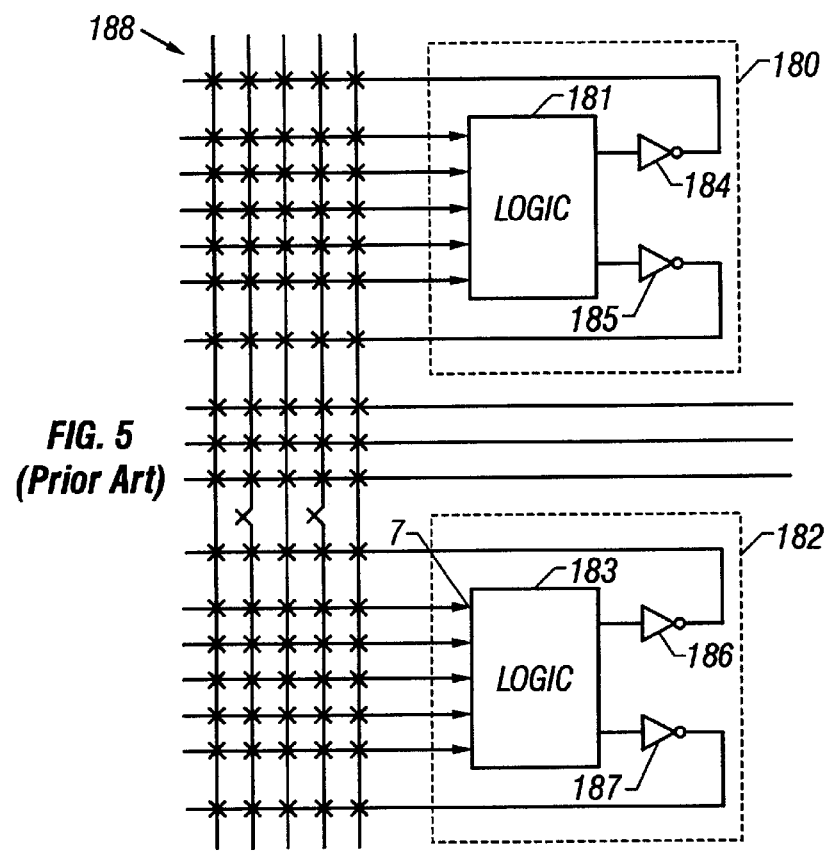
FIG. 5 is a simplified diagram of two logic modules including output drivers.

FIG. 5 is a simplified diagram of two logic modules 180 and 182. Logic modules 180 and 182 include a logic cell 181 and 183, respectively, which may be, e.g., logic cell 110b, discussed in reference to FIG. 4. The output terminals of logic modules 180 and 182 (only two are shown for the sake of simplicity), however, are coupled to drivers 184–187. Drivers 184–187 are coupled to the programmable interconnect structure 188. To prevent high voltages from damaging the low voltage logic transistors of the drivers 184–187 during antifuse programming, the drivers typically include protection transistors, which are rendered non-conductive during programming, but are otherwise conductive.

Figure 6:
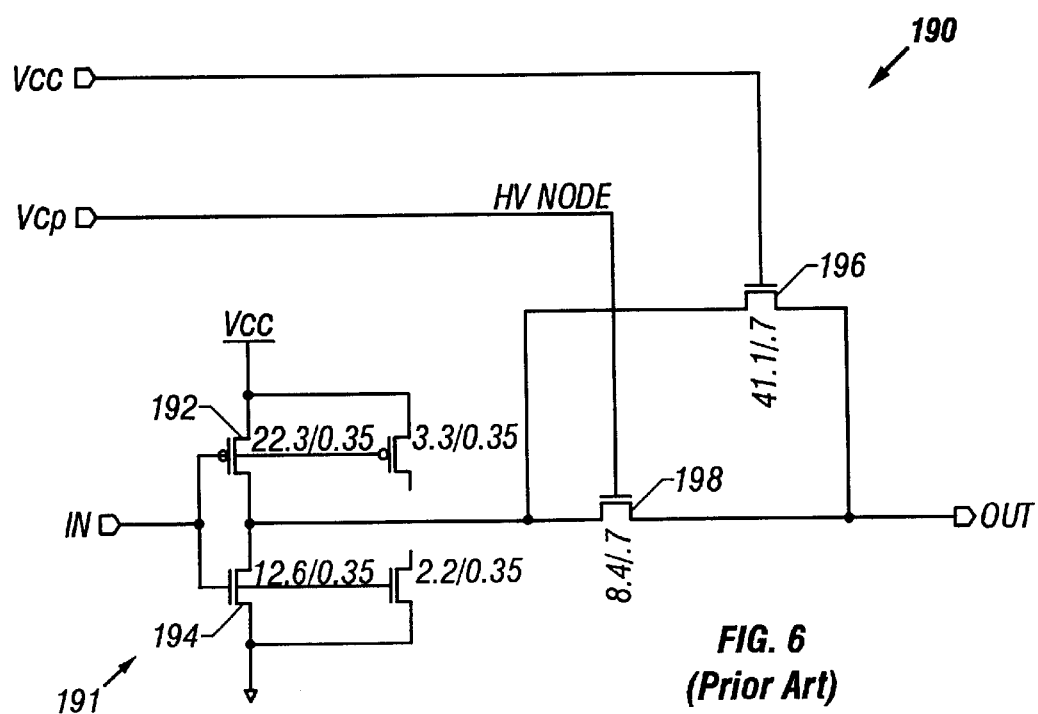
FIG. 6 shows a detailed diagram of a conventional driver used with a logic module.

FIG. 6 shows a detailed diagram of a conventional driver 190, which includes an inverter 191 having a P-channel low voltage logic transistor 192 and an N-channel low voltage logic transistor 194, a relatively large high voltage N-channel protection transistor 196 and a relatively small high voltage N-channel protection transistor 198. The gate of protection transistor 196 is coupled to Vcc, e.g., 5.0 volts, during normal operation and is coupled to ground potential, e.g., 0 volts, during programming to isolate the inverter 191 from the high programming voltages potentially present in the programmable interconnect structure 188 of FIG. 5 during antifuse programming. The gate of protection transistor 198 is coupled to a charge pump voltage Vcp, which may be for example, 7.8 volts, during normal operation and is coupled to ground potential to isolate the inverter 191 during programming. Protection transistor 198 (whose gate is supplied with a charge pump voltage Vcp, which is greater than Vcc) is provided so that inverter 191 can supply the necessary current to drive the programmable interconnect structure 188 with Vcc (no threshold voltage is dropped across transistor 198 due to its gate being supplied with the higher voltage Vcp). For more details on driver 190, see U.S. Pat. No. 6,028,444, entitled "Three-Statable Net Driver For Antifuse Field Programmable Gate Array," issued Feb. 22, 2000, by Wong et al., which is incorporated herein by reference.

Figure 7:
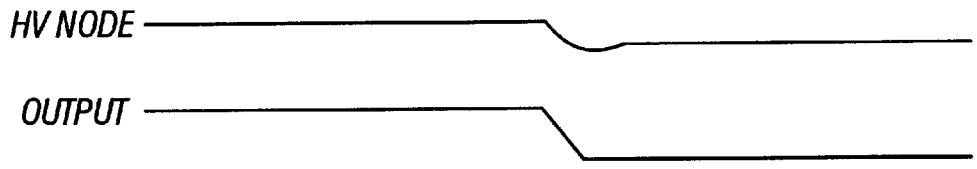
FIG. 7 shows a waveform diagram of the voltages at the output terminal and a high voltage node in the driver of FIG. 6.

FIG. 7 shows a waveform diagram of the voltages at the output terminal (OUTPUT) of inverter 191 and the high voltage node (HV NODE) at the gate of protection transistor 198. As can be seen in FIG. 7, when inverter 191 switches from a logic high to a logic low, the voltage at the gate of protection transistor 198 will be pulled down. The charge pump that provides the charge pump voltage Vcp to protection transistor 198 is shared by many inverters in the device. Consequently, if multiple inverters simultaneously switch from a logic high to a logic low, the charge pump voltage Vcp at the gate of protection transistor 198 may be pulled down significantly, which may affect the performance of protection transistor 198. The voltage at HV NODE slowly rises over a period of time as long as the output signal is a logic low, as shown in FIG. 7.

Figure 8:
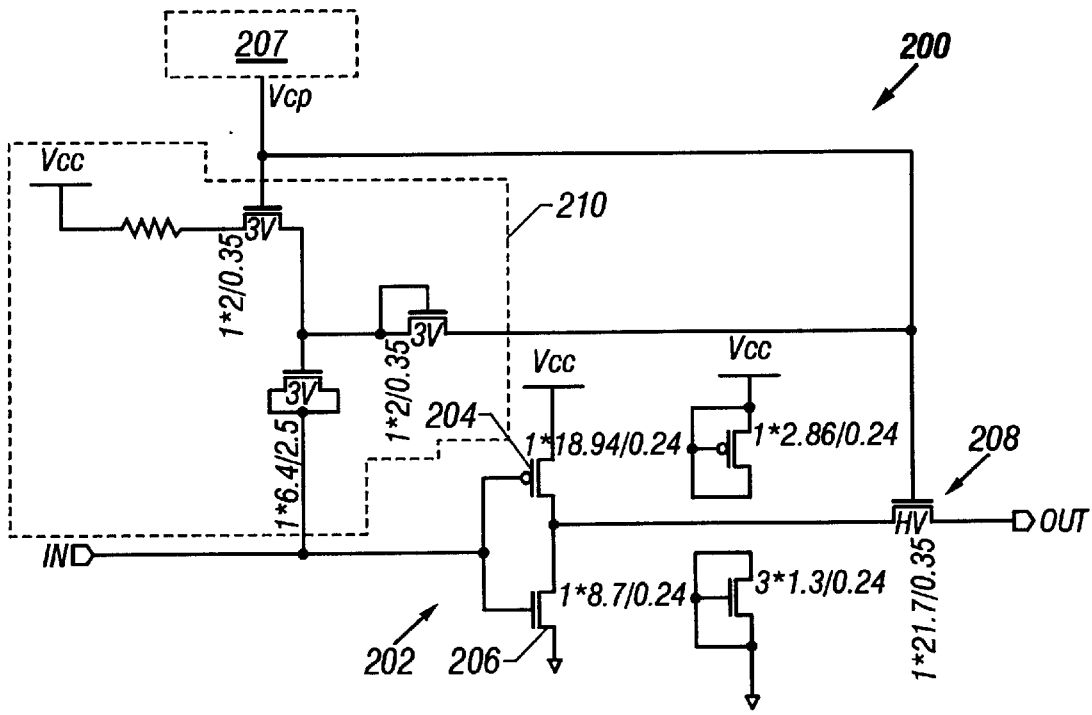
FIG. 8 shows a detailed diagram of a driver in accordance with an embodiment of the present invention.

FIG. 8 shows a detailed diagram of a driver 200 in accordance with an embodiment of the present invention. As shown in FIG. 8, driver 200 includes an inverter 202, including a P-channel low voltage logic transistor 204 and an N-channel low voltage logic transistor 206. Driver 200 also includes a relatively large, e.g., 21.7/0.35 high voltage N-channel protection transistor 208 and a secondary charge pump 210 coupled to the gate of the protection transistor 208 of FIG. 8. The gate of protection transistor 208 is also coupled to a conventional charge pump 207 that produces a voltage Vcp, e.g., 4 volts, during normal 2.5 volt operation and is coupled to ground potential, e.g., 0 volts, to isolate the inverter 202 from high programming voltages potentially present in the programmable interconnect structure 188 during antifuse programming. The secondary charge pump 210 associated with driver 200, advantageously prevents the voltage at the gate of protection transistor 208 from being pulled down significantly. Consequently, the output of driver 200 is relatively insensitive to the number of other drivers coupled to the charge pump that may be simultaneously switching from a logic high to low. Moreover, the die area required by driver 200 is smaller than the area required by a conventional driver.

Figure 9:
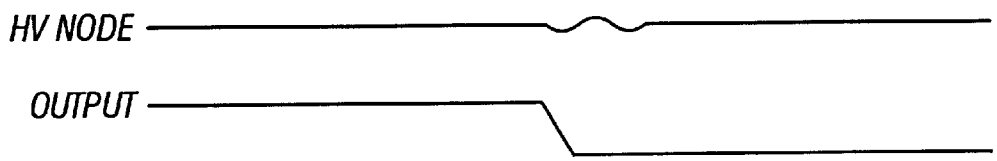
FIG. 9 shows a waveform diagram of the voltages at the output terminal and a high voltage node of the driver of FIG. 8.

FIG. 9 shows a waveform diagram of the voltages at the output terminal (OUTPUT) of inverter 202 and the high voltage node (HV NODE) at the gate of protection transistor 208. Because driver 200 includes a secondary charge pump 210, when inverter 202 switches from a logic high to a logic low, the voltage at the gate of protection transistor 208 will not be pulled down significantly.

Figure 10:
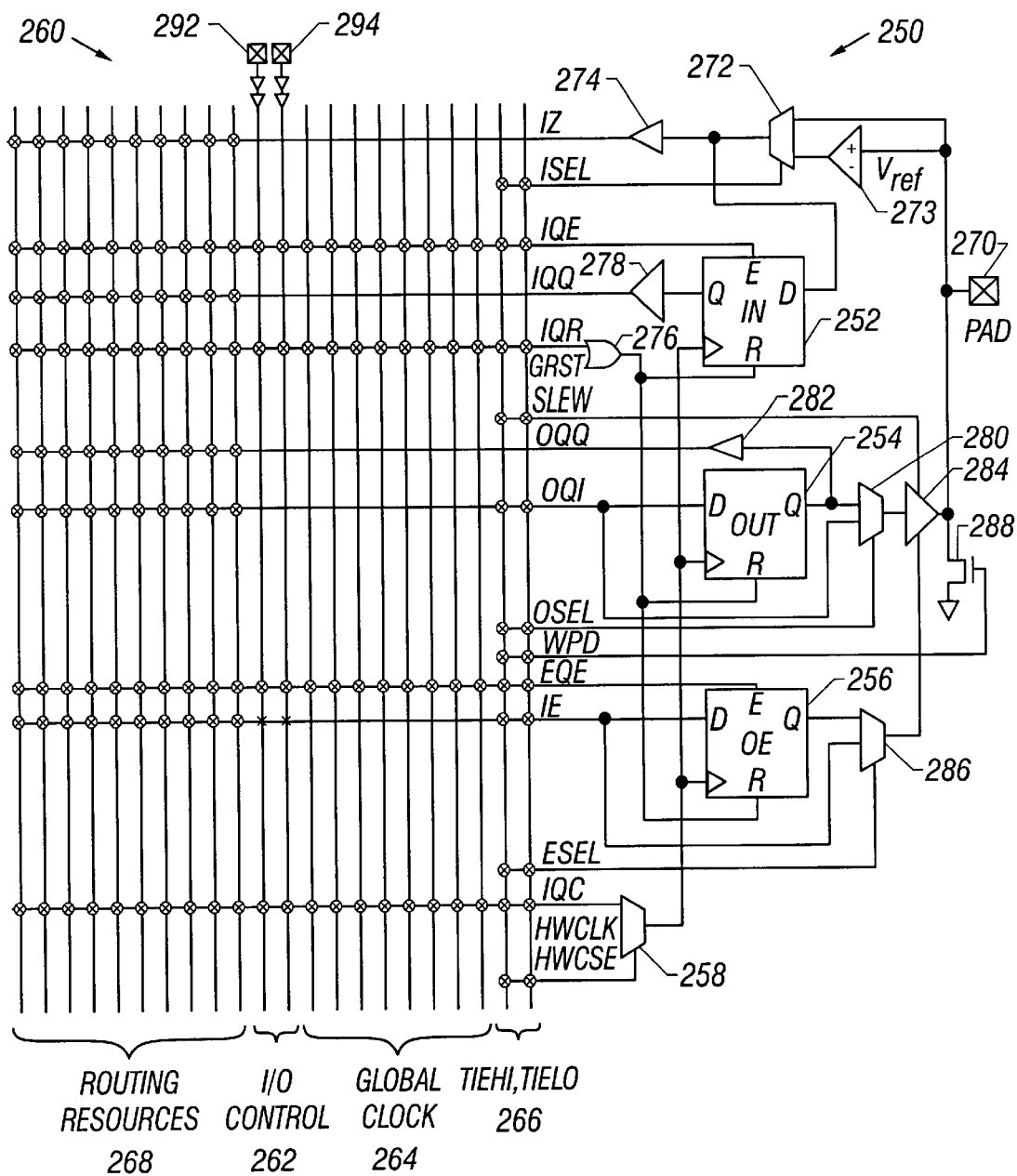
FIG. 10 shows an input/output (I/O) circuit, in accordance with an embodiment of the present invention.

FIG. 10 shows an input/output (I/O) circuit 250, in accordance with an embodiment of the present invention. I/O circuit 250 may be used as each I/O cell 106 shown in FIGS. 1 and 2. I/O circuit 250 includes an input register 252, an output register 254, and an output enable register 256, which, advantageously, permit I/O circuit 250 to be programmed for input, output, or bi-directional operation. The I/O circuit 250 is connectable to the programmable interconnect structure 260, which includes I/O control lines 262, global clock lines 264, tiehi and tielo lines 266, which are coupled to power buses, and routing resources 268. As shown, registers 252, 254, and 256 are controlled by clock and reset signals, and registers 252 and 256 are also controlled by clock enable. The clock, clock enable, and reset signals can come from the routing resources 268, from one of the global clocks 264, the I/O control lines 262, or the tiehi or tielo lines 266. The clock and reset signals share a common line, while the clock enables for registers 252 and 256 can be independently controlled. The registers 252, 254, and 256 can also be controlled by a hardwired clock HWCKL via 2:1 multiplexer 258.

I/O circuit 250 includes a pad 270 that is connected to the data input terminal of input register 252 via 2:1 multiplexer 272. A differential translator 273 is connected to the other data terminal of multiplexer 272. The output terminal of multiplexer 272 is directly connectable to the routing recourses 268 of the programmable interconnect structure 260 via buffer 274. The select terminal of multiplexer 272 is driven by one of the tiehi and tielo lines 266. The enable terminal of input register 252 may be programmably controlled by I/O control lines 262, global clock 264, tiehi and tielo lines 266, or routing resources 268. Similarly, the reset terminal of input register 252 may be programmably controlled by programmable interconnect structure 260, via OR gate 276, where the second input terminal to OR gate 276 is coupled to global reset (GRST) used during power on reset. The output terminal of input register 252 is coupled to routing resources 268 via buffer 278.

For input functions, I/O circuit 250 can provide combinatorial, registered data or both simultaneously to the logic array. For combinatorial input operation, data is routed from I/O pad 270, through the input buffer 274, via multiplexer 272, and to the desired array logic through routing resources 268. For registered input operation, data is routed from I/O pad 270 to the D input of input register 252, allowing data to be captured without consuming internal logic cell resources.

The data terminal of output register 254 is programmably connectable to routing resources 268, as well as the tiehi and tielo lines 266. The reset terminal of output register 254 is coupled to OR gate 276. The output terminal of output register 254 is coupled to a data terminal of 2:1 multiplexer 280 and is also fed back to routing resources 268 via buffer 282. The other data terminal of 2:1 multiplexer 280 is coupled to the data terminal of output register 254. The select terminal of multiplexer 280 is programmably driven by one of the tiehi and tielo lines 266. The output terminal of multiplexer 280 is coupled to a three-state output buffer 284. The slew of buffer 284 may be programmably controlled by connecting buffer 284 to either tiehi or tielo lines 266, as will be discussed in more detail below.

Thus, advantageously, for output functions the I/O pad 270 can receive combinatorial or registered data from the logic array through routing resources 268. For combinatorial output operation, data is routed from the logic array through routing resources 268 and to the I/O pad 270, via multiplexer 280 and buffer 284. For registered output operation, the logic is routed from the logic array to the D input of the output register 254, which in turn drives the I/O pad 270 via multiplexer 280 and buffer 284. The addition of output register 254 decreases the time from clock to out (TCO). Moreover, because the output register 254 does not drive the routing, a tri-state inverter plus one inversion can be eliminated from the output path and the length of the path is also reduced compared to a previous embodiments in which the routing originated from a macrocell in the logic array.

The data terminal of output enable register 256 is programmably connectable to routing resources 268, as well as the tiehi and tielo lines 266. The enable terminal of output enable register 256 may be programmably coupled to programmable interconnect structure 260, while the reset terminal is coupled to OR gate 276. The output terminal of output enable register 256 is coupled to one of the data terminals of 2:1 multiplexer 286. The other data terminal of multiplexer 286 is coupled to the data terminal of output enable register 256, while the select terminal is programmably controlled by one of tiehi and tielo lines 266. The output terminal of multiplexer 286 is coupled to an enable terminal of buffer 284 and is used to enable or disable buffer 284.

Thus, the three-state output buffer 284 controls the flow of data from the array logic to the I/O pad 270 and allows the I/O pad 270 to act as an input and/or output terminal. The buffer's 284 output enable can be individually controlled by a logic cell array or any pad (through the regular routing resources), or bank-controlled through one of the global networks. The control signal for buffer 284 can be either combinatorial or registered. For combinatorial control operation, data is routed from the logic array, via routing resources 268, through multiplexer 286 and to the three-state output buffer 284. For registered control operation, the data is routed to drive the D input of the output enable register 256, which in turn drives the three-state output buffer 284 through multiplexer 286.

A weak pull-down transistor 288 is coupled to pad 270. The gate of pull-down transistor 288 is programmably coupled to one of tiehi and tielo lines 266. The use of weak pull-down transistor 288 eliminates the need for an external pull down resistor for used I/O circuits. Thus, for output functions, I/O pad 270 can be configured for active HIGH, active LOW, or open-drain inverting operation. In the active HIGH and active LOW modes, the pad is fully 3.3 V compliant. When I/O pad 270 is not to be used as an output, the output enable control can be permanently disabled, allowing the output register 254 to be used for registered feedback into the logic array via buffer 282 to increase total register count.

Figure 11:
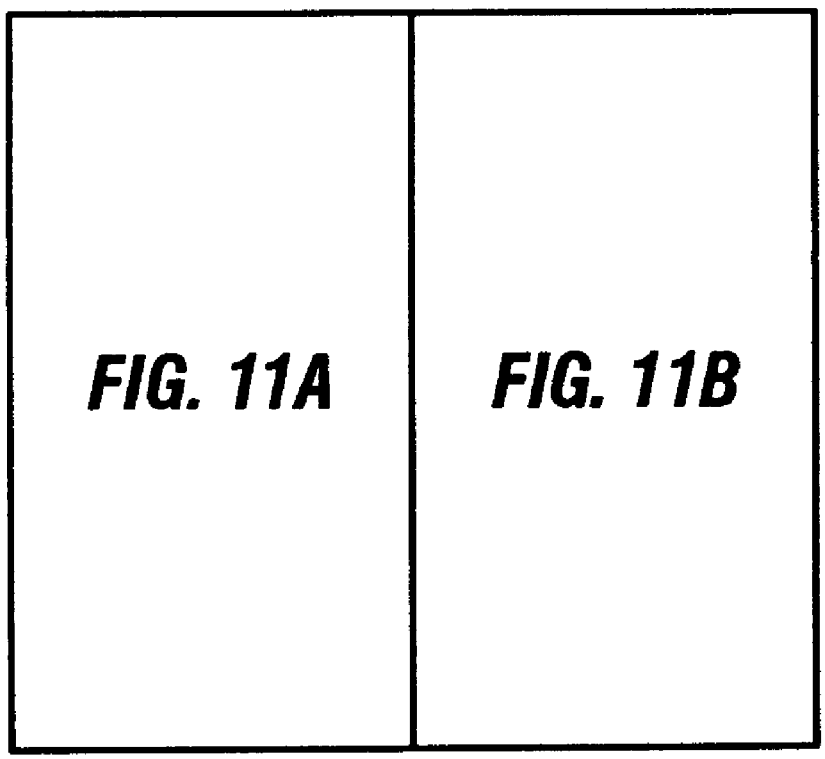
FIG. 11, which includes
Figure 11A:
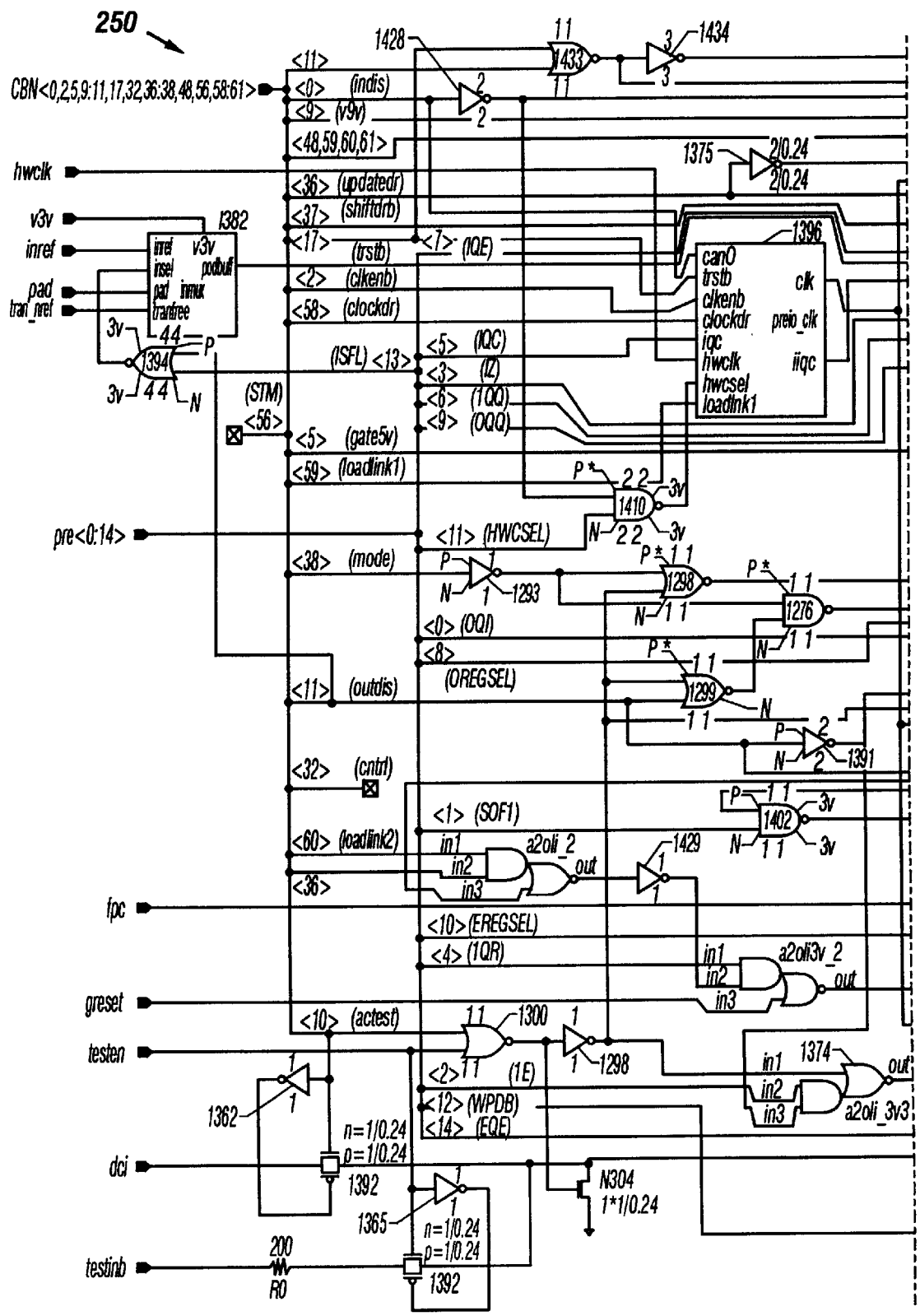
FIGS. 11A and 11B, shows a more detailed schematic of the I/O circuit of FIG. 10.
Figure 11B:
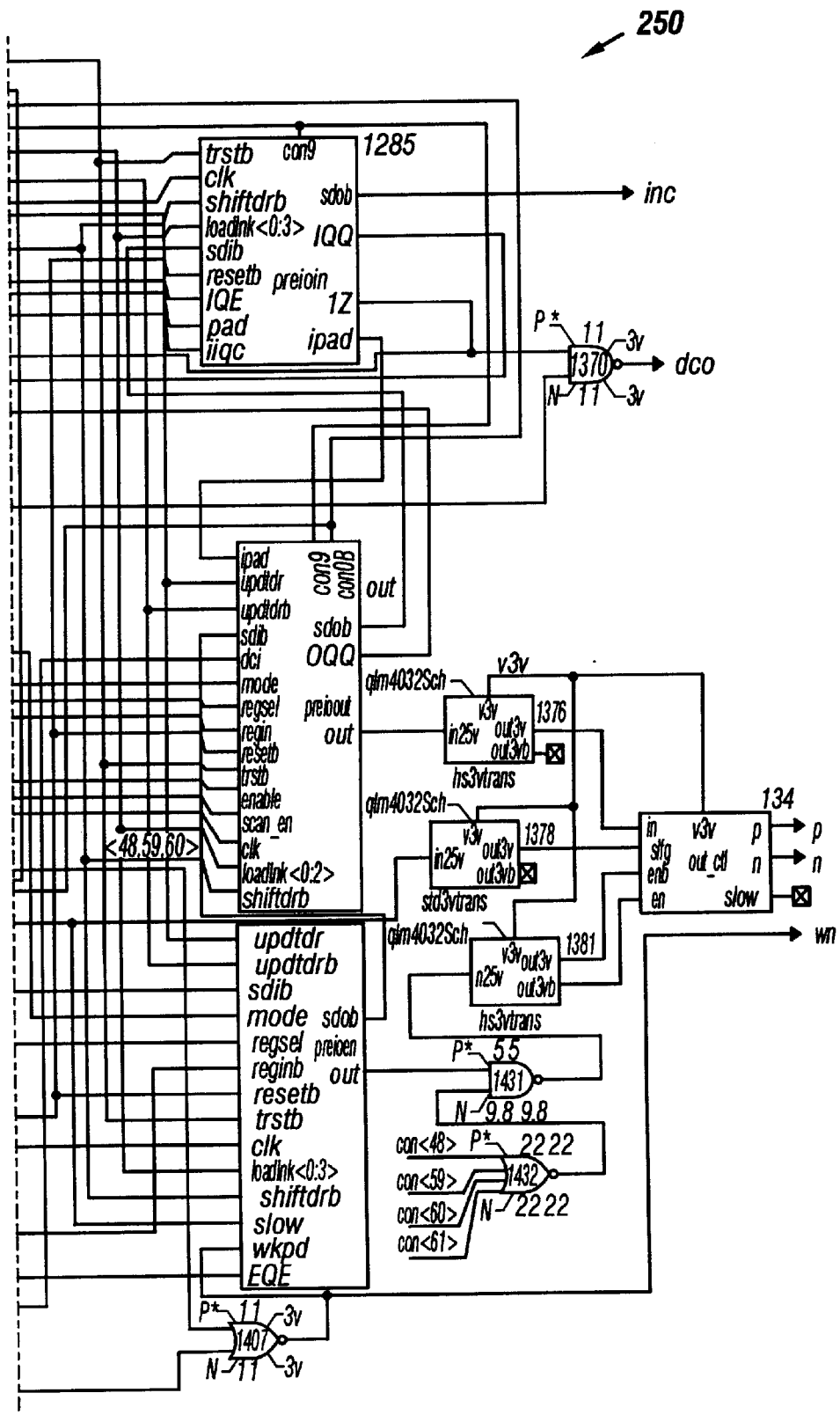

In addition, a programmable device in accordance with the present invention includes a boundary scan circuit that uses the input, output and output enable registers 252, 254, and 256 as boundary scan registers under the Joint Test Action Group standard (JTAG—IEEE Standard 1149.1), which advantageously reduces the area on the integrated circuit required to implement the JTAG standard. FIG. 11 shows a more detailed schematic of I/O circuit 250. The test reset bar (trstb) shown in FIG. 11, controls whether I/O circuit registers 252, 254, and 256 are used for the JTAG test or for normal I/O purposes. The from-previous-cell (fpc) input terminal links I/O circuit 250 with the previous I/O cell used in the JTAG testing, while the to-next-cell (tnc) output terminal links I/O circuit 250 with the next I/O cell used in the JTAG testing. Thus, the input, output and output enable registers 252, 254, and 256 of the I/O circuit 250 are shared with the JTAG circuitry. The implementation and operation of JTAG boundry scan is well understood in the art.

Figure 12:
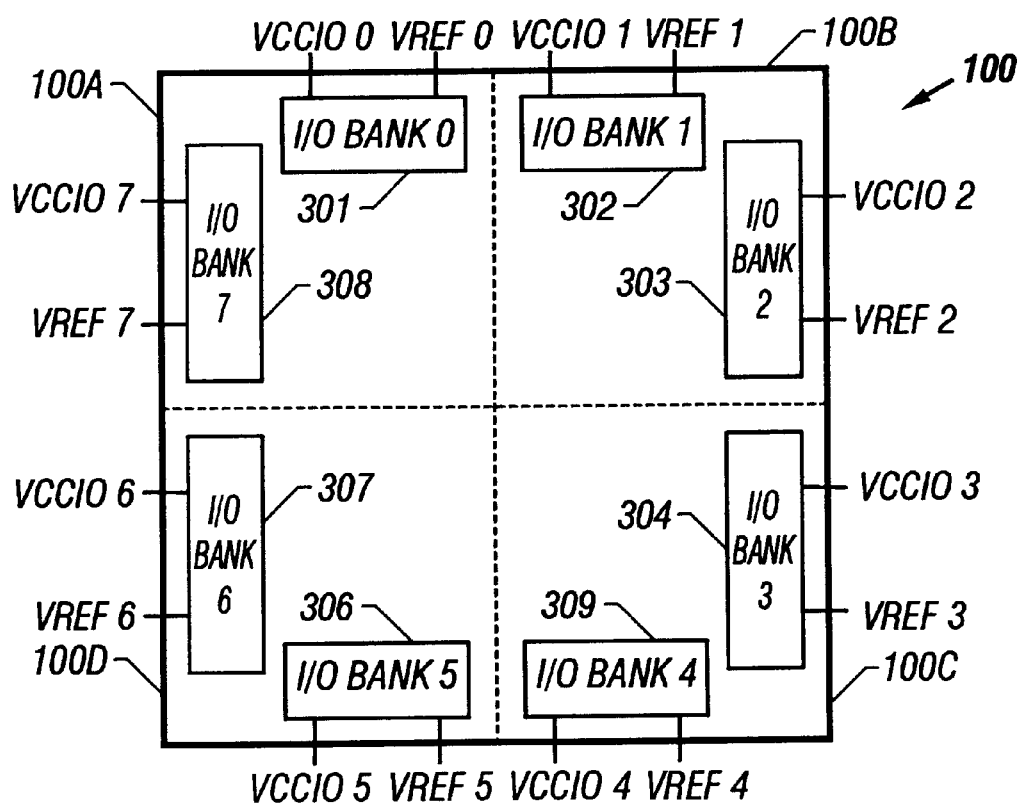
FIG. 12 shows a schematic view of an FPGA with eight I/O banks, in accordance with an embodiment of the present invention.

FIG. 12 shows a schematic view of FPGA 100 with eight I/O banks 301–308, in accordance with an embodiment of the present invention. Each I/O bank is independent of other I/O banks and has a separate VCCIO and VREF input. Each I/O bank may include a plurality of I/O circuits, e.g., 55 to 144 I/O circuits, such as I/O circuit 250 shown in FIG. 10. As shown in FIG. 12, each I/O bank is associated with a quadrant 100A, 100B, 100C, or 100D of FPGA 100.

In accordance with another embodiment of the present invention, differential translator 273 and multiplexer 272 of FIG. 10, and the VCCIO of FIG. 12 associated with the I/O bank can be used to programmably control I/O circuit 250 to be compliant with multiple I/O standards, e.g., CMOS and differential standards. The VCCIO pad for the bank in which I/O circuit 250 is located may be tied to a 3.3 volt supply or a 2.5 volt supply. Thus, the I/O specification is configurable by altering the VCCIO voltage, i.e., either 2.5 volts or 3.3 volts. In addition, the I/O standard may be configured by the reference voltage VREF for the bank in which I/O circuit is located, which may be varied to, e.g., 1.0, 1.25, or 1.5 volts. The I/O standard may also be configured using the select terminal of multiplexer 272, which is used to select between the data signal directly from pad 270 or via differential translator 273. Table 1 below summarizes the I/O specifications that can be supported by I/O circuit 250.

TABLE 1

| I/O Standard | Reference Voltage (VREF) | Input Swing | Output Voltage | VCCIO Voltage |
| --- | --- | --- | --- | --- |
| LVTTL | n/a | 0–3.3 | 3.3 | 3.3 |
| LVCMOS2 | n/a | 0–2.5 | 2.5 | 2.5 |
| PCI | n/a | 0–3.3 | 3.3 | 3.3 |
| GTL+ | 1 | 0.8–1.2 | n/a | 2.5a |
| SSTL3 | 1.5 | 1.3–1.7 | 3.3 | 3.3 |
| SSTL2 | 1.25 | 1.07–1.43 | 2.5 | 2.5 |

Each I/O circuit within a bank will be tied to the same voltage supply, and thus, all I/O circuits within a single bank will have the same output voltage, i.e., either 2.5 volt or 3.3 volt. In addition, both a differential standard and a non-differential standard may be supported within a single bank of I/O circuits, e.g., one I/O circuit may use the differential translator 273, by appropriate selection of multiplexer 272, while another I/O circuit within the same bank may receive the data directly from pad 270. Different differential standards, however, may not be supported within a single bank, because only one reference voltage is provided per bank.

Each bank of I/O circuits includes two I/O control input only pads 292, 294, shown in FIG. 10. The I/O control input pads 292, 294 can be programmed to drive the reset, clock, and enable inputs of registers 252, 254, and 256. In addition, the input pads 292, 294 may be used as high drive inputs to the FPGA, e.g., may be connected directly to macrocells within the local quadrant 100A, 100B, 100C or 100D in the FPGA 100.

Figure 13:
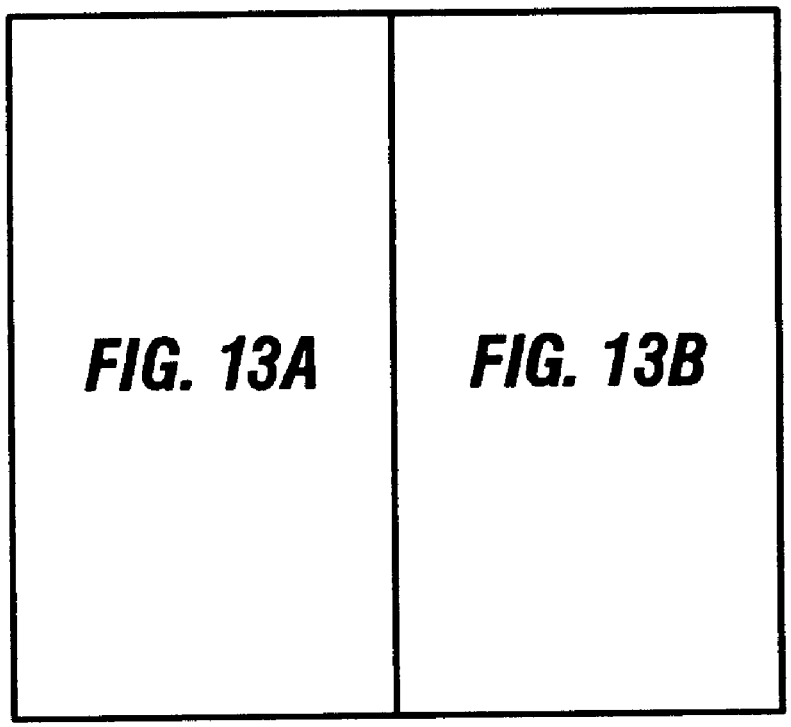
FIG. 13, which includes
Figure 13A:
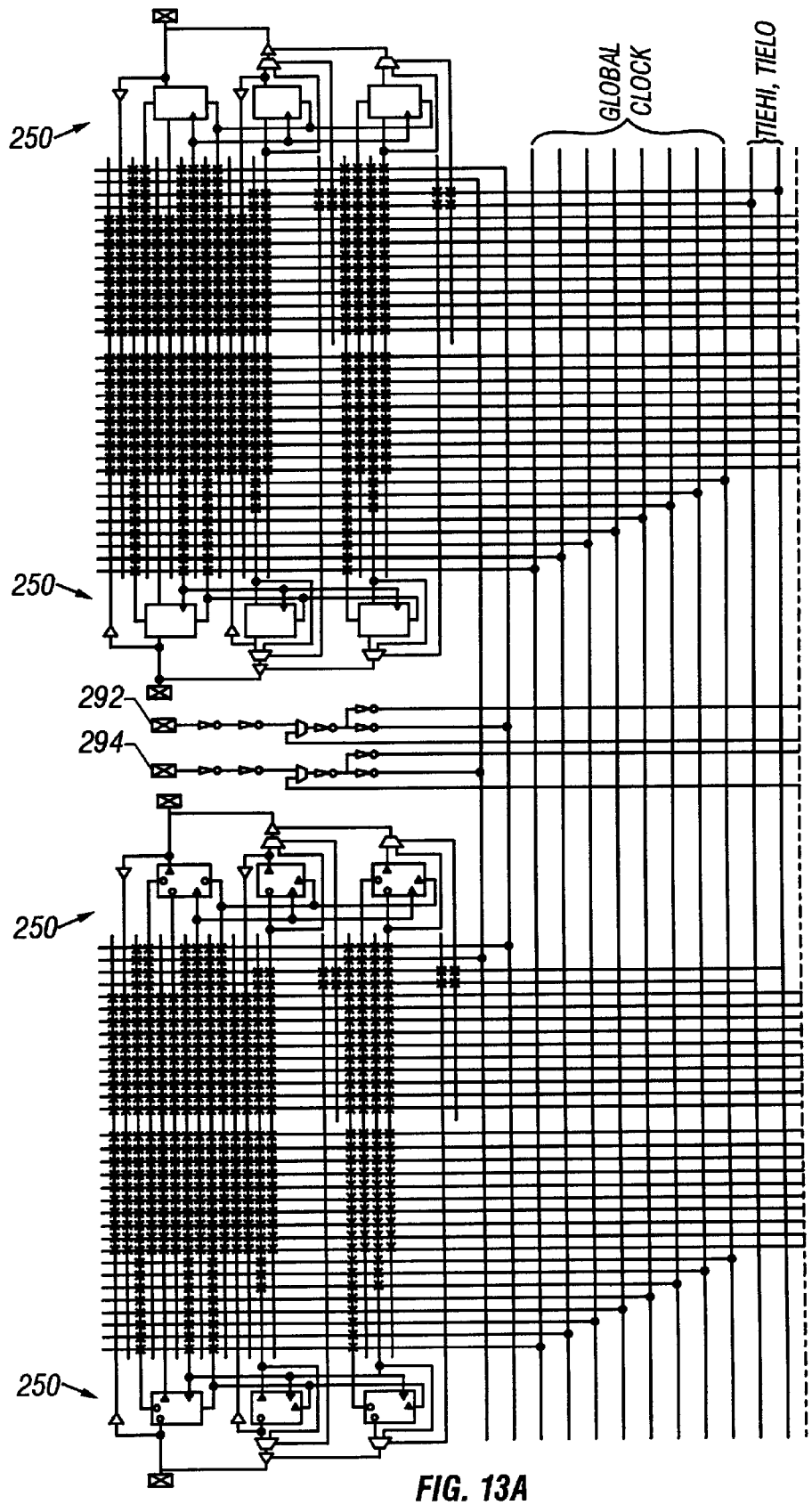
FIGS. 13A and 13B, shows a schematic view of a portion of a single quadrant in accordance with the present invention.
Figure 13B:
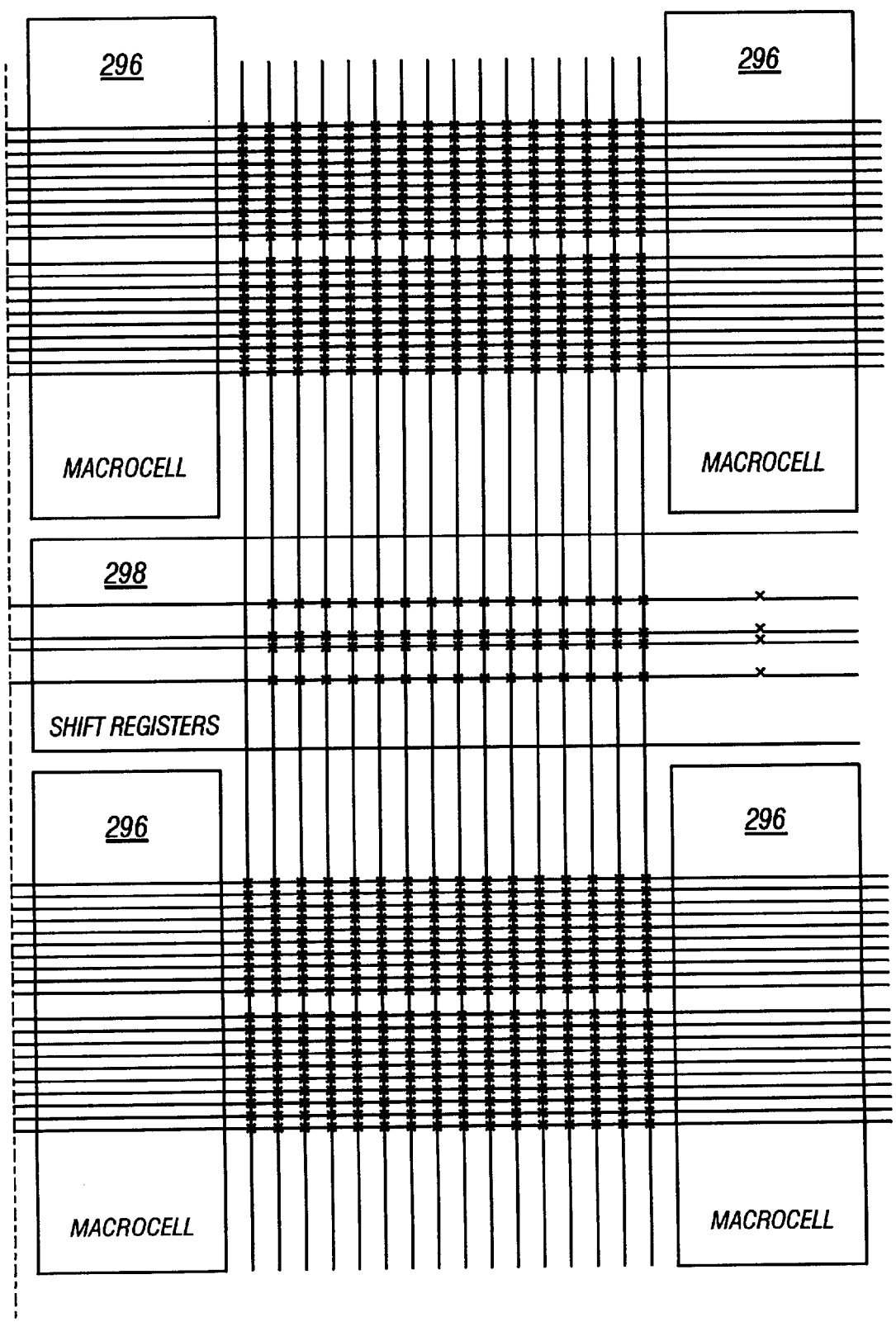

FIG. 13 shows a top down diagram of a portion of a quadrant 100A in FPGA 100, with four I/O circuits 250. As shown in FIG. 13, I/O control input pads 292, 294 may be programmably coupled to any of the desired I/O circuits 250 within the bank as well as to any of the macrocells 296, which may be similar to macrocell 102 described in reference to FIG. 3. The I/O control input pads 292, 294 are routed through the macrocell array. FIG. 13 shows the routing of I/O control input pads over shift register cells 298, which may be the shift register cells 109 shown in FIG. 2, but it should be understood that the routing of I/O control input pads need not be connected to shift register cells 298.

Figure 14A:
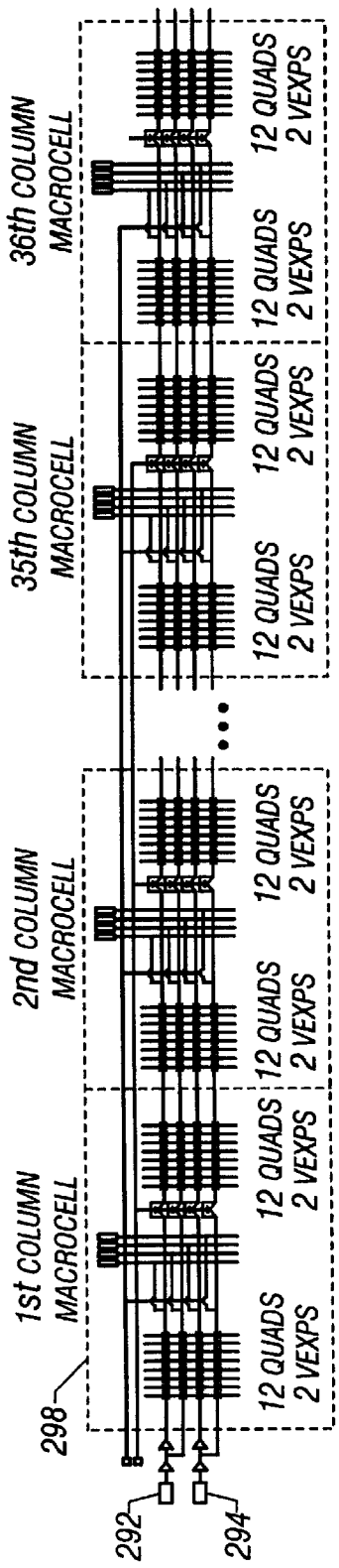
FIGS. 14A and 14B show horizontal lines from I/O control input pads that run left-to-right and right-to-left in an FPGA.
Figure 14B:
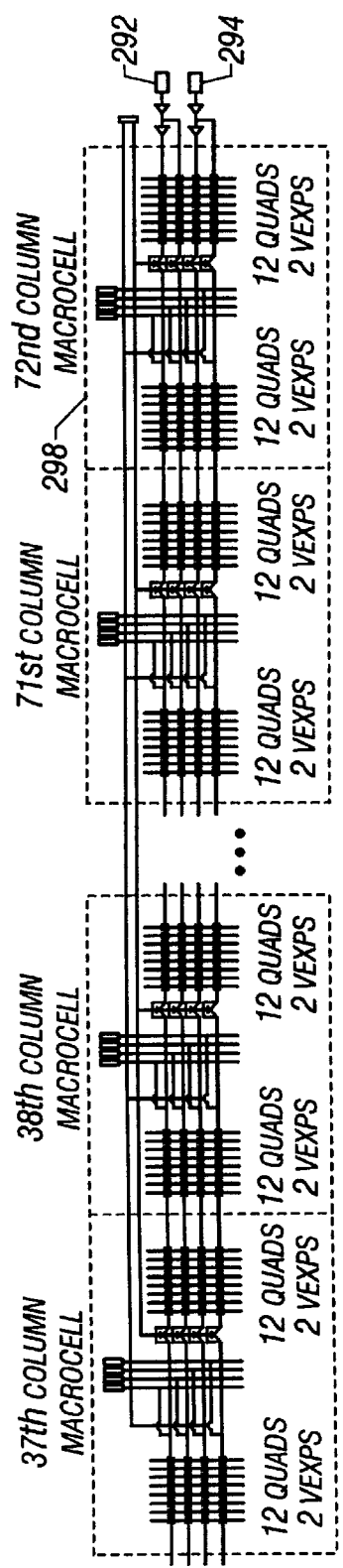

FIGS. 14A and 14B show horizontal lines from I/O control input pads 292, 294 that run left-to-right and right-to-left through FPGA 100, respectively. Similar to FIG. 13, it should be understood that the horizontal routing of I/O control input pads 292, 294 are shown overlying shift register cells 298, but that the routing for I/O control input pads 292, 294 need not be connected to shift register cells 298. FIG. 14A, for example, shows shift register cells 298 that run horizontally within one quadrant 100A of FPGA 100. Each shift register cell 298 are aligned with a column of macrocells, running from the $1^{st}$ column of macrocells to the $36^{th}$ column of macrocells within the quadrant. Of course, there may be any desired number of macrocell columns within a quadrant. Within each column of logic, the horizontal lines from I/O control input pads 292, 294 can be programmably coupled to a number of vertical quad lines, e.g., twelve, and a number of vertical express lines, e.g., two. FIG. 14B is substantially similar to FIG. 14A, but shows shift register cells 298 within quadrant 100B of FPGA 100, and thus is the mirror image of FIG. 14A.

Figure 15A:
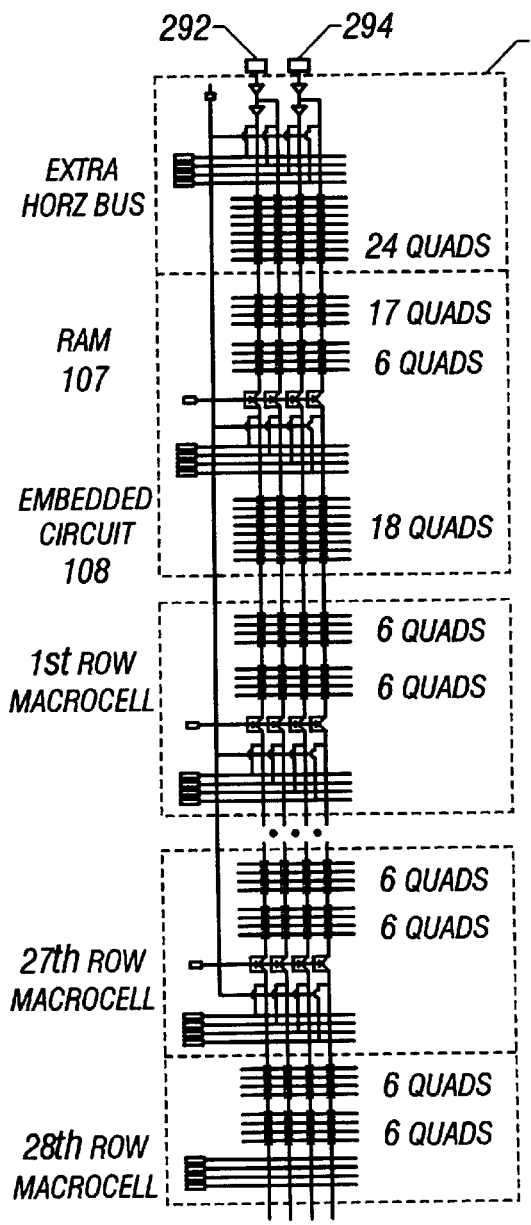
FIGS. 15A and 15B show vertical lines from I/O control input pads that run top-to-bottom and bottom-to-top in an FPGA.
Figure 15B:
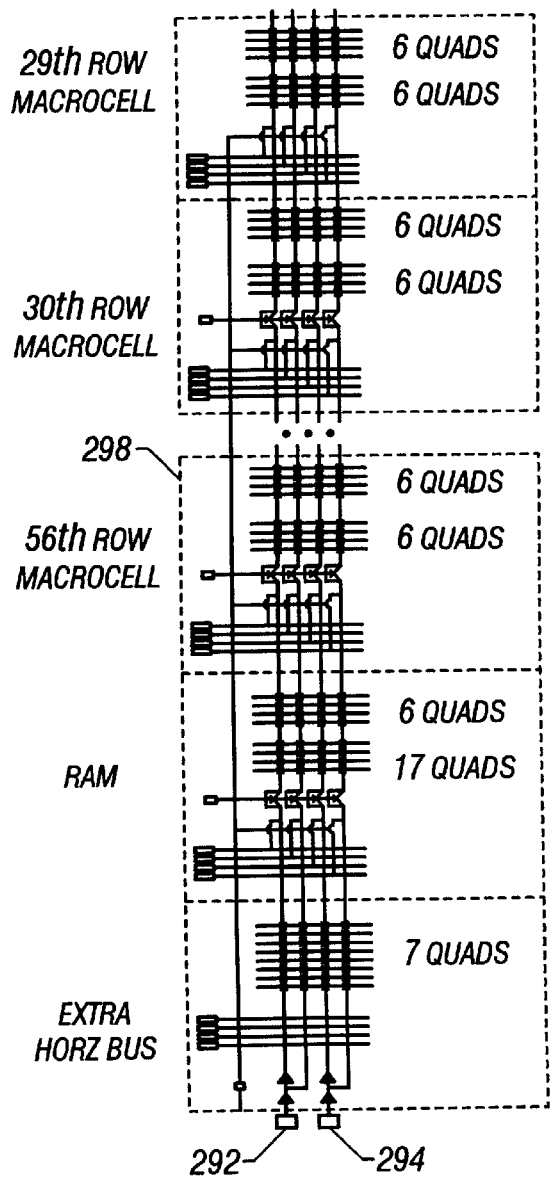

FIGS. 15A and 15B show vertical lines from I/O control input pads 292, 294 that run top-to-bottom and bottom-to-top in FPGA 100, respectively. Similar to FIGS. 14A and 14B, it should be understood that the vertical routing of I/O control input pads 292, 294 are shown overlying shift register cells 298, but that the vertical routing for I/O control input pads 292, 294 need not be connected to shift register cells 298. FIG. 15A, for example, shows shift register cells 298 that run vertically within one quadrant 100A of FPGA 100. As shown in FIG. 15A, within the first shift register cell 298 the vertical lines from I/O control input pads 292, 294 can be programmably coupled to a number of extra horizontal bus quad lines, e.g., twenty four. The next shift register cell 298 is aligned with the RAM blocks 107, shown in FIG. 2, and may be coupled to a large group of quad lines, e.g., seventeen, and a smaller group of quad lines, e.g., six. The same shift register cell may also be aligned with the other embedded circuit 108, if present, by another group of quad lines, e.g., eighteen. The subsequent shift register cells 298 are aligned with rows of macrocells, running from the $1^{st}$ row of macrocells to the $28^{th}$ row of macrocells within the quadrant. Of course, there may be any desired number of macrocell rows within a quadrant. Within each shift register cell 298 the vertical lines from I/O control input pads 292, 294 can be programmably coupled to a number of horizontal quad lines, e.g., two groups of six. FIG. 15B is substantially similar to FIG. 15A, but shows shift register cells 298 within quadrant 100D of FPGA 100, and thus is the mirror image of FIG. 15A, except that FIG. 15B does not include a second embedded circuit 108. In addition, the number of extra horizontal bus quad lines in quadrant 100D, may be less than in quadrant 100A. Thus, for example, FIG. 15B shows seven extra horizontal bus quad lines.

In accordance with another embodiment of the present invention, I/O circuit 250 has a programmable output slew rate. A slower slew rate may be achieved by, e.g., coupling buffer 284 to tiehi. A slow slew rate, e.g., 1.0 V/ns for VCCIO of 3.3 volts and 0.6 V/ns for a VCCIO of 2.5 volts, can be used, advantageously, to reduce noise. A fast slew rate, achieved by coupling output buffer 284 to tielow, will produce a rising edge slew rate of approximately 2.8 V/ns for VCCIO of 3.3 volts and a rate of 1.7 V/ns for a VCCIO of 2.5 volts.

Figure 16:
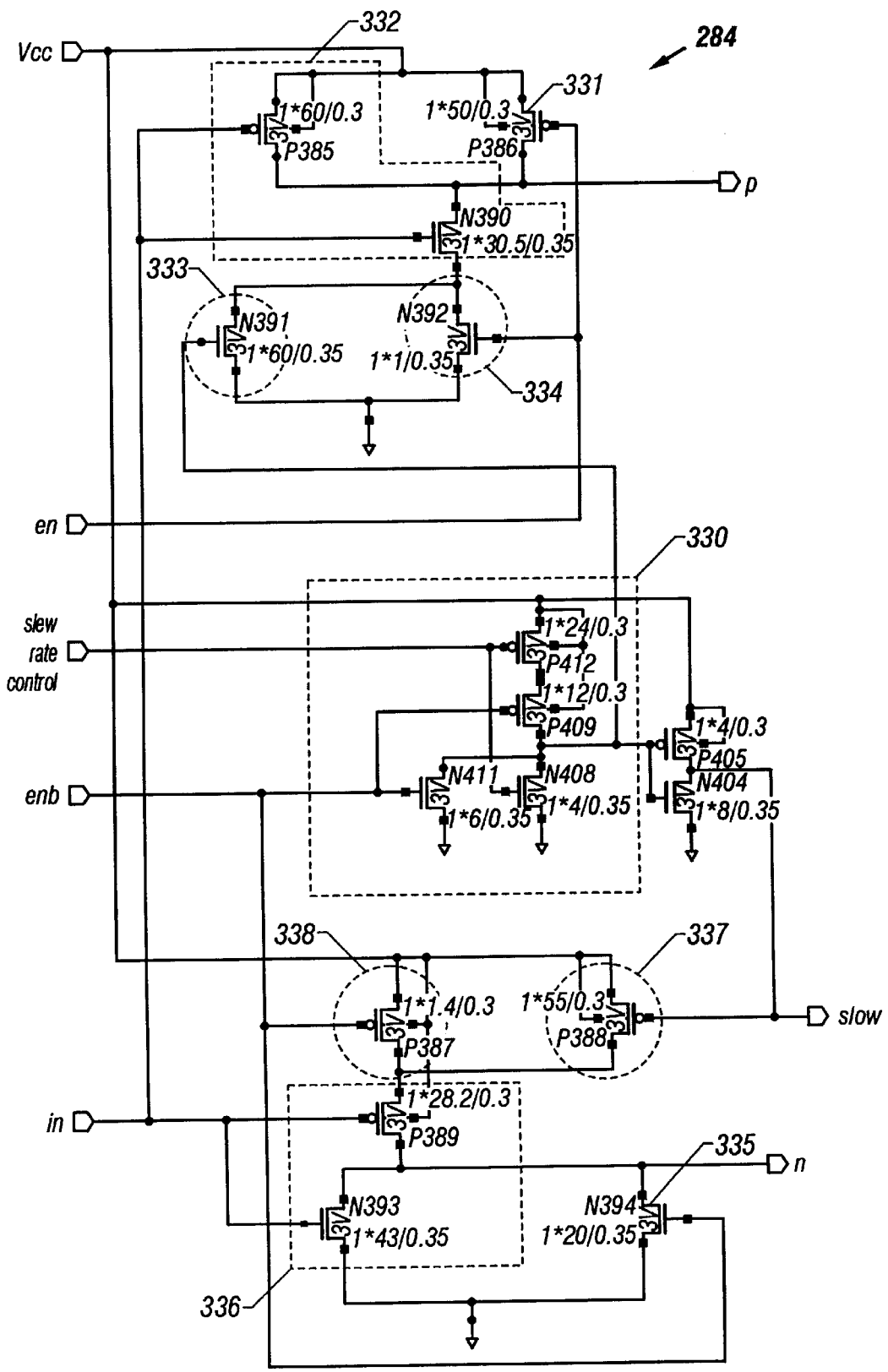
FIG. 16 shows a schematic view of tri-state output buffer, which can be controlled to produce a variable output slew rate.

FIG. 16 shows a schematic view of tri-state output buffer 284, which permits a variable output slew rate. Output buffer 284 includes a NOR logic gate 330 that receives the slew rate control signal from one of tiehi and tielo lines 266 and an enable bar (enb) signal. Output buffer 284 receives the input signal on terminal (in) that is received by a first inverter 332 with an output terminal (p) and a second inverter 336 with an output terminal (n). Output buffer 284 may be disabled by rendering PMOS transistor 331 and NMOS transistor 335 conductive by the enable (en) and enable bar (enb) signals, respectively. When output buffer 284 is enabled, the slew of inverters 332 and 336 are controlled by the output signal from NOR logic gate 330. As shown in FIG. 16, inverter 332 is coupled to ground through a large NMOS transistor 333 and through a relatively small NMOS transistor 334. When a slow slew rate is desired, the small transistor 334 is rendered conductive, which acts as a resistive element, and the large transistor 333 is rendered non-conductive via NOR logic gate 330. Consequently, the slew rate for the transition from high to low for inverter 332 is slowed. If a fast slew rate is desired, however, the large transistor 333 is rendered conductive permitting a fast transition from high to low for inverter 332.

Similarly, inverter 336 is coupled to Vcc through a large PMOS transistor 337 and through a relatively small PMOS transistor 338. When a slow slew rate is desired, the small transistor 338 is rendered conductive, and acts as a resistive element, and the large transistor 338 is rendered non-conductive via an inverted output signal from NOR logic gate 330. Consequently, the slew rate for the transition from low to high for inverter 336 is slowed. If a fast slew rate is desired, however, the large transistor 337 is rendered conductive, permitting a fast transition from low to high for inverter 336.

The programming architecture of FPGA 100 to program an antifuse includes a number of transistors between the antifuse and the programming voltage and between the antifuse and ground. An antifuse is programmed, i.e., caused to be conductive, by rendering the programming transistors conductive to apply the programming voltage across the antifuse.

FIG. 17, shows by way of example, a conventional programming architecture 350 used to program an antifuse 352, which is used to link conductors 353 and 354. As shown in FIG. 17, conventional programming architecture uses NMOS programming circuitry. Thus, the programming architecture 350 includes, in series, an NMOS Vpp select transistor 356, which is coupled to a programming high voltage source Vpp, an NMOS shift register transistor 358, and a local programming NMOS transistor 360, which is coupled to antifuse 352. Antifuse 352 is also coupled to a low voltage source, e.g., ground, via a second local program NMOS transistor 362, a second NMOS shift register transistor 364, and an NMOS ground select transistor 366. For 0.35 μtechnology, the programming voltage Vpp is approximately 10.5 volts. A high voltage charge pump (not shown) is used to provide the voltage hlg, which may be e.g., 12 volts, at the gates of the NMOS transistors in programming architecture 350. During programming, the NMOS programming circuitry requires that the gate voltage hlg is a higher potential than the programming voltage VPP in order to pass the full programming voltage VPP through the NMOS transistors.

In accordance with an embodiment of the present invention, the programming architecture 370 of FPGA 100 uses CMOS programming circuitry, as shown in FIG. 18. The programming architecture 370 of FPGA 100 includes a programming voltage Vpp select NMOS transistor 372a and PMOS transistor 372b, an NMOS shift register transistor 374a and PMOS shift register transistor 374b, and a local programming NMOS transistor 376a and PMOS transistor 376b coupled to antifuse 371. Antifuse 371 couples conductor 373 with conductor 375. Antifuse 371 is also coupled to a low voltage source, e.g., ground, via a second local program NMOS transistor 378a and PMOS transistor 378b, a second NMOS shift register transistor 380a and PMOS shift register transistor 380b, and an NMOS ground select transistor 382. Advantageously, with the use of PMOS transistors in parallel with the NMOS transistors, as shown in FIG. 18, no charge pump is required in the programming circuitry. The gates of the NMOS transistors are driven by the CMOS circuitry and has approximately the same voltage hlg as VPP during programming. The gates of the PMOS transistors is the inverse of the gates of NMOS transistors and is grounded /hlg during programming. Use of CMOS programming architecture advantageously permits a lower programming voltage, e.g., Vpp may be 7.5 volts, and lower gate voltage at the NMOS transistors, e.g., 8 volts, because of the PMOS transistors. This is particularly important for the use of 0.25 μ technology, which will not support a high gate voltage without diode break down. Thus, with programming architecture 370, antifuse 371 will receive a sufficiently high programming voltage.

Figure 19A:
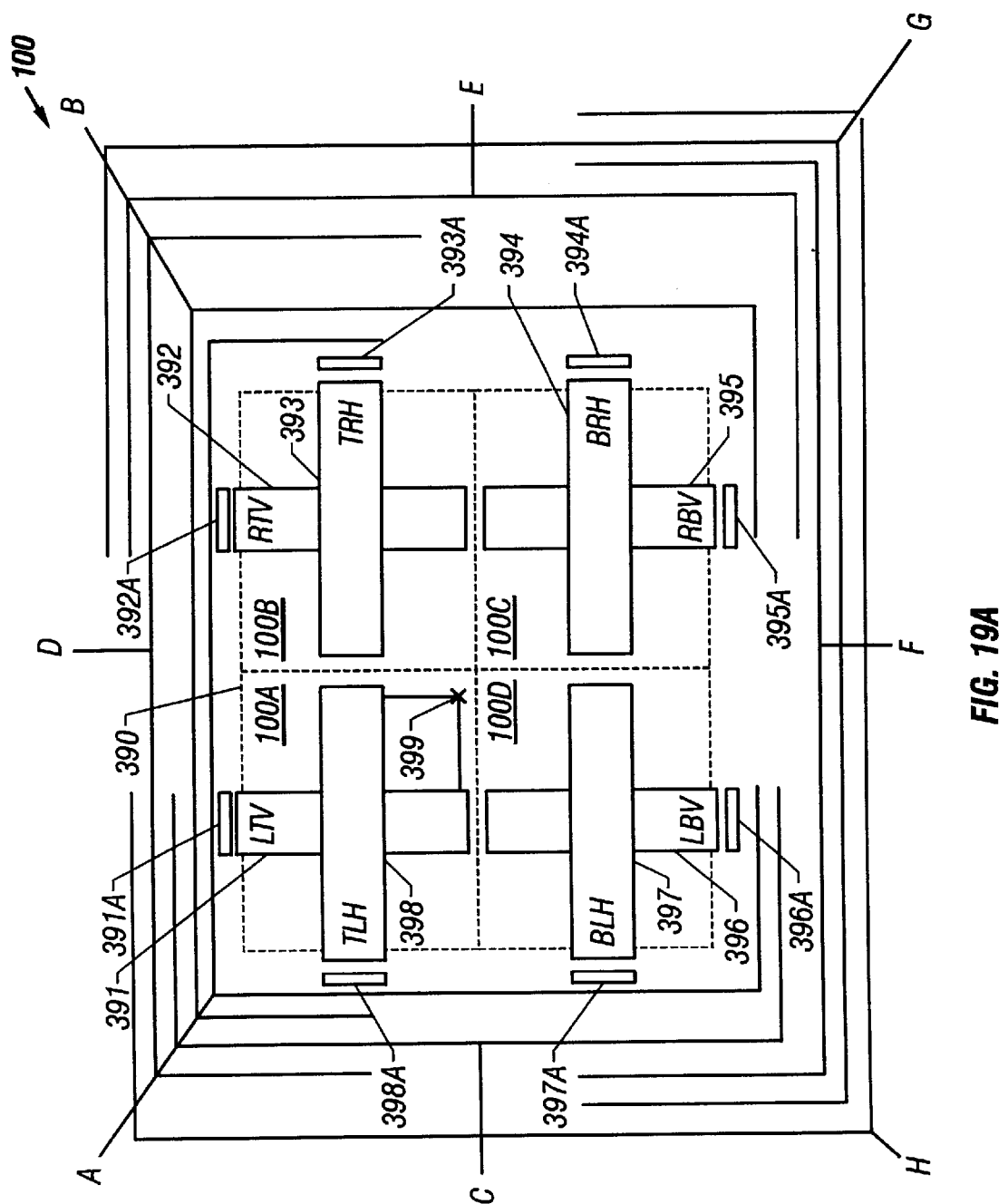
FIG. 19A is a diagram illustrating the structure of the programming shift registers in accordance with an embodiment of the present invention.

FIG. 19A is a diagram illustrating the structure of the programming shift registers in accordance with another embodiment of the present invention. FIG. 19A shows an array 390 of macrocells disposed in the center of an FPGA, which may be, e.g., the FPGA 100 shown in FIG. 2. FPGA 100 includes eight programming shift registers 391–398 that are disposed within array 390 with two programming shift registers per quadrant. A vertical and horizontal programming shift register, e.g., 391 and 398, are arranged approximately through the center of each quadrant, e.g., the top left quadrant 100A, such that the quadrant is divided into four sections. The programming drivers and programming control drivers that drive programming conductors and programming control conductors that extend horizontally in the top left quadrant 100A of the array are disposed at the periphery of programming shift register 391. Similarly, the programming drivers and programming control drivers that drive programming conductors and programming control conductors that extend vertically in the top left quadrant 100A of the array are disposed in programming shift register 398. The remainder of the programming drivers and programming control drivers are similarly situated in the other programming shift registers.

Each programming shift register is coupled to a separate programming current multiplexer circuit that is located at the periphery of the programming shift register. Thus, for example, programming shift register 391 is coupled to programming current multiplexer circuit 391A. Each programming current multiplexer circuit is controlled to couple one of a plurality of power buses, including a ground bus (not shown) to its associated programming shift register.

Each programming driver has a bit in its programming shift register. When this bit is set, the programming driver is enabled to drive its programming conductor with the voltage supplied from its programming current multiplexer circuit. When the bit is not set, the programming driver is isolated from its programming conductor (and does not drive its programming conductor with any voltage). Similarly, each programming control driver has a bit in its associated programming shift register. When this bit is set, the programming control driver drives its programming control conductor with a high voltage sufficient to turn on a programming transistor such that the programming transistor can pass the programming voltage onto its associated routing wire. When this bit is not set, the programming control driver drives its programming control conductor with a non-asserted voltage, i.e., a high voltage for the PMOS transistors and a low voltage for the NMOS transistors, which turns off the programming transistors.

As shown in FIG. 19A, in one embodiment FPGA 100 includes eight programming power buses and their associated pins, labeled A, B, C, D, E, F, G, and H, and thus, FPGA 100 is capable of 8 bit programming. Four of the power buses C, D, E, and F extend around two quadrants of array 390. Thus, for example, power bus F extends from the right side of the bottom right quadrant 100C to the left side of the bottom left quadrant 100D. Thus, power bus F may be coupled to programming shift registers 394–397. The longer power buses A, B, G, and H however, extend around three quadrants. Thus, for example, power bus G extends from the top of the top right quadrant 100B to the left of bottom left quadrant 100D, and may be coupled to programming shift registers 392–397. Accordingly, the multiplexer circuits 391A–398A may couple its associated programming shift registers 391–398 to five power buses. In one embodiment, however, only four of the possible five power buses may be coupled to the programming shift registers, which advantageously decreases the size of the associated multiplexer circuit, without significantly decreasing flexibility of the design. The programming voltage pins of power buses A, B, C, D, E, F, G, and H are provided on FPGA 100 so that each programming power bus is coupled to its own programming voltage terminal and so that the ground bus is coupled to ground terminals. Accordingly, the enabled programming drivers in a programming shift register conduct current from one of eight programming voltage terminals or the ground terminals depending on how the programming current multiplexer circuit is controlled.

Because each pair of programming shift registers divides a quadrant into fourths, the distance from the programming shift registers to an antifuse to be programmed is reduced compared to conventional designs with the programming shift registers located at the periphery of the array 390. Thus, for example, if an antifuse 399a is to be programmed, a high programming voltage may be provided by programming shift register 398, while ground is provided by programming shift register 391. The distance between the shift registers 391 and 398 to the antifuse 399a is approximately half what it would be if the shift registers were located outside the array 390 of macrocells. The reduced distance is advantageous because wide power buses are located within programming shift registers, while narrow conductors are used between the programming shift registers to the antifuses. The reduced distance from the programming shift registers to the antifuse to be programmed, thus, ensures that an adequate amount of programming current flows through each antifuse being programmed.

Figure 19B:
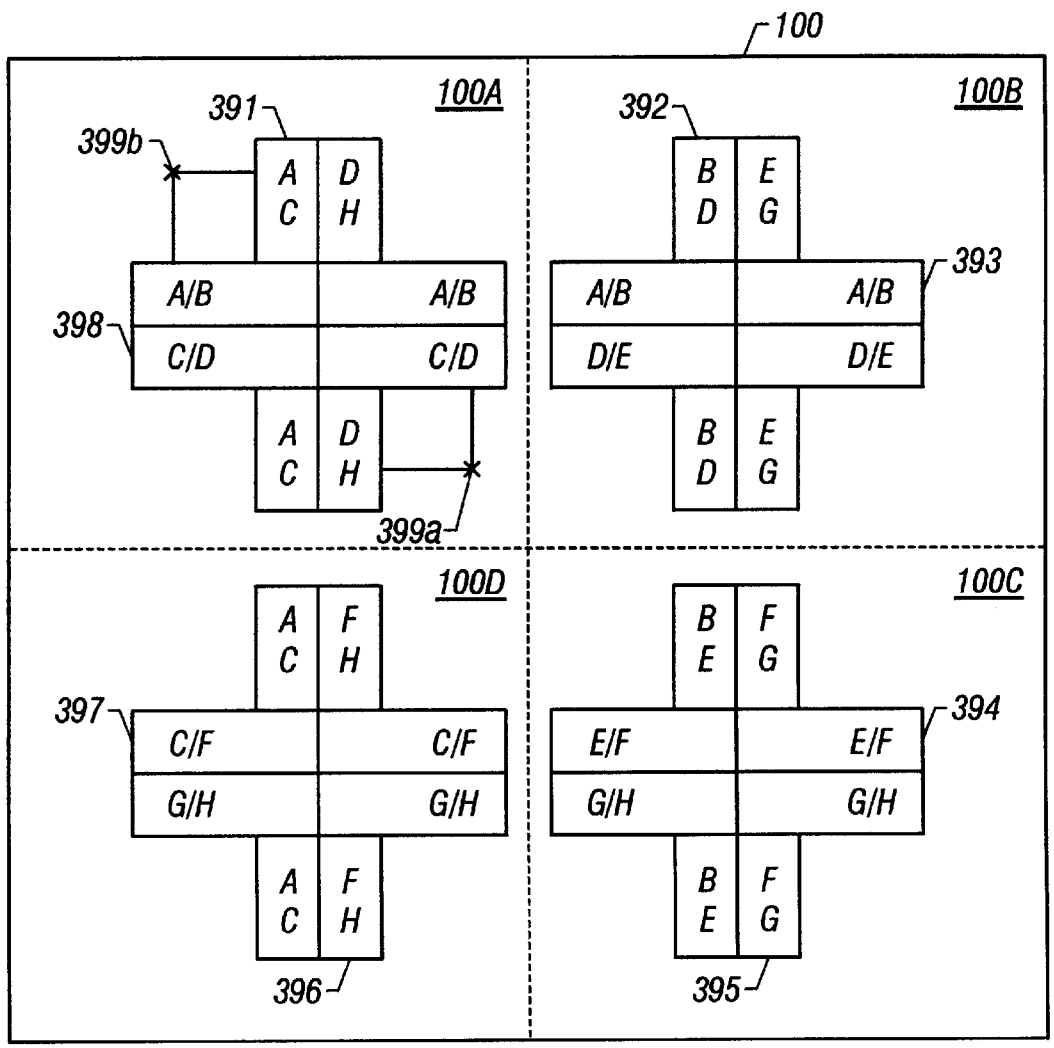
FIG. 19B is a diagram illustrating the operation of the programming shift registers and eight bit programming in accordance with an embodiment of the present invention.

FIG. 19B is a schematic diagram of FPGA 100 illustrating the operation of shift registers 391–398. Each shift register is capable of providing four different programming voltages, labeled A, B, C, D, E, F, G, and H, which correspond with power buses A, B, C, D, E, F, G, and H, shown in FIG. 19A. Each pair of shift registers divides each quadrant in FPGA 100 into sub-quadrants. Thus, for example, shift registers 391 and 398 divide quadrant 100A into four quadrants. The other quadrants, 100B, 100C, and 100D are similarly subdivided. Each shift register can provide one of two programming voltages in one direction and one of a different two programming voltages in the opposite direction. For example, shift register 391 can provide either programming voltages A or C horizontally to the left portion of quadrant 100A and can provide either programming voltages D or H horizontally to the right portion of quadrant 100A. Shift register 398 can provide either programming voltages A or B vertically to the top portion of quadrant 100A and can provide either programming voltages C or D vertically to the bottom portion of quadrant 100A. Thus, antifuse 399a in the bottom right portion of quadrant 100A may be programmed using programming voltages C or D extending vertically from shift registers 398 and programming voltages D or H extending horizontally from shift registers 391. Likewise, antifuse 399b in the top left portion of quadrant 100A may be programmed using programming voltages A or B extending vertically from shift registers 398 and programming voltages A or C extending horizontally from shift registers 391. If a programming voltage is used to program one antifuse, however, it is not used to simultaneously program another antifuse. Thus, for example, if antifuse 399b is programmed using programming voltages A and C, antifuse 399a may be programmed using only D and H. Accordingly, FPGA 100 can use 8 bit programming to efficiently program antifuses throughout the FPGA.

Figure 20:
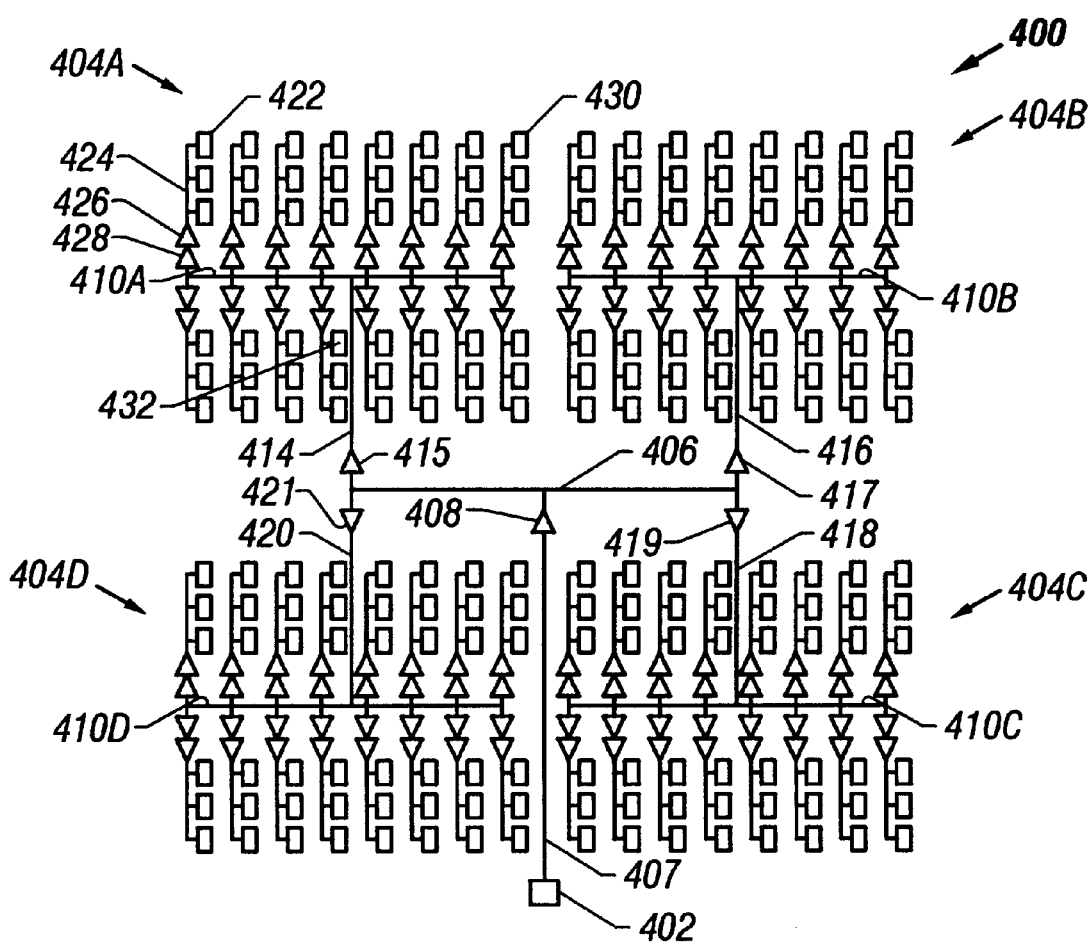
FIG. 20 is a schematic diagram of the clock distribution network in an FPGA, in accordance with an embodiment of the present invention.

FIG. 20 is a schematic diagram of the clock distribution network 400 in an FPGA in accordance with an embodiment of the present invention. Clock distribution network 400 distributes a global clock signal from a dedicated clock pad 402 to four separate quadrants 404A, 404B, 404C, and 404D of the FPGA. Pad 402 is coupled to primary horizontally extending clock bus 406 through bus 407 and a buffer 408. Clock bus 406 extends to the four separate quadrants 404A, 404B, 404C, and 404D and is coupled to bisecting horizontally extending clock buses 410A, 410B, 410C and 410D, through respective buffers 415, 417, 419, and 421 and vertical extending clock buses 414, 416, 418, and 420. The bisecting horizontally extending clock buses may be programmably coupled to a plurality of macrocells 422 through a plurality of vertically extending buses 424 and buffers 426, 428. Each of the bisecting horizontally extending clock buses 410A, 410B, 410C, and 410D approximately bisects their respective quadrants, such that approximately the same number of macrocells are on each side of the bisecting bus. Thus, a number of vertical buses 424 extend from bisecting bus in one direction and a number of vertical buses extend from bisecting bus in the opposite direction. It should be understood that the clock distribution network 400 is programmable to connect any macrocell to the dedicated clock pad 402. The connection of any macrocell 422 within FPGA to the clock network 400 is described in detail in U.S. Pat. No. 5,892,370, entitled "Clock Network For Field Programmable Gate Array," issued Apr. 6, 1999, by Eaton et al, which is incorporated herein by reference.

Because clock distribution network 400 uses horizontally extending clock buses 410A, 410B, 410C, and 410D that bisects and extends through the each individual quadrant 404A, 404B, 404C, and 404D, the clock signal skew is advantageously minimized. Thus, for example, a macrocell 430 that is furthest from the horizontally extending clock bus 410A will receive a clock signal that is only slightly skewed from a clock signal received by a macrocell 432 that is the closest to the vertically extending clock bus 414. If, on the other hand, a horizontal clock bus did not approximately bisect the quadrant, but instead was positioned at the bottom of the quadrant with each vertical clock bus extending in the same direction away from the bus, the macrocell farthest from the horizontal bus would receive a clock signal that had a relatively large skew compared to the clock signal received by the macrocell closest to the horizontal bus.

Figure 21:
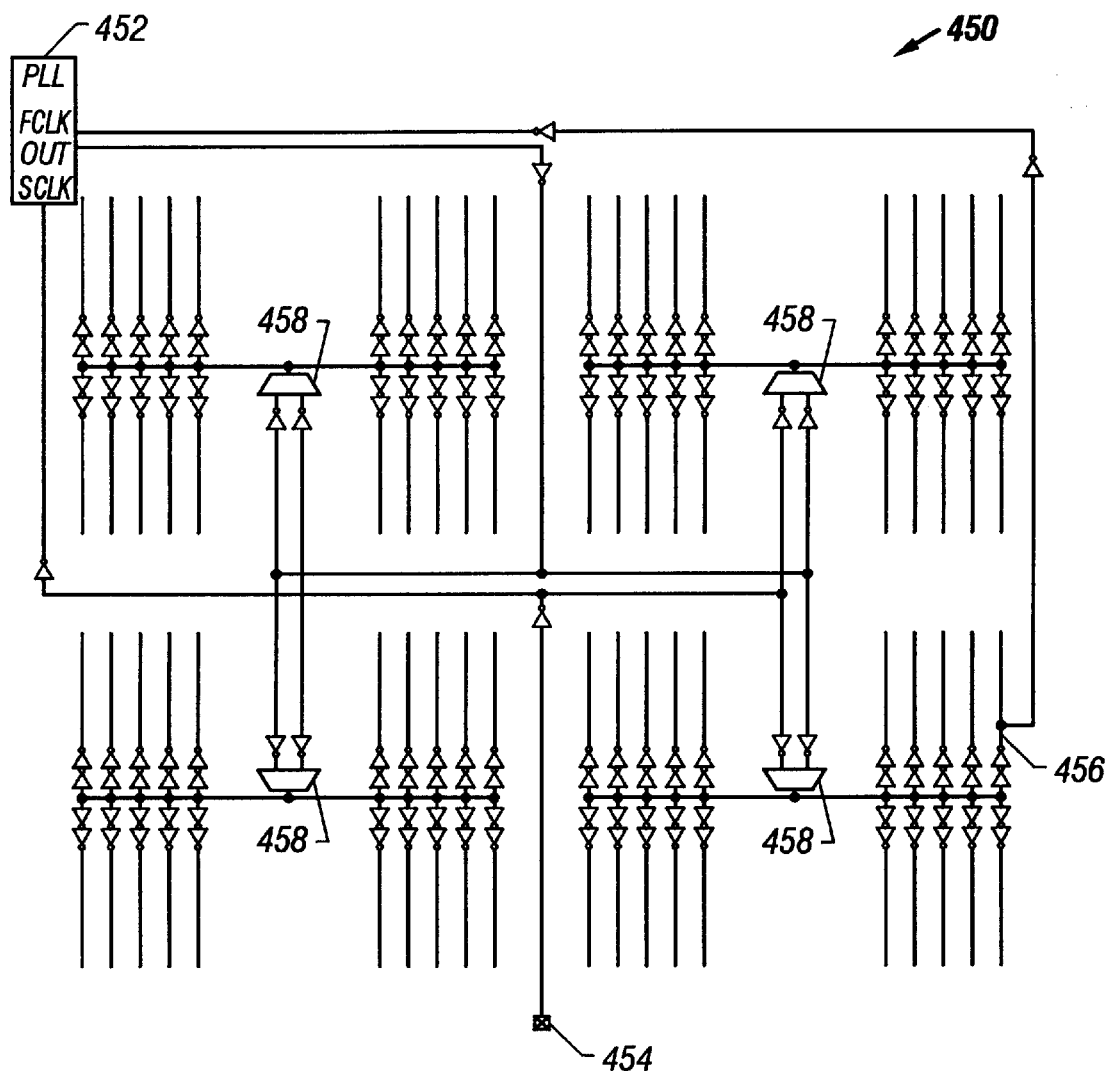
FIG. 21 shows a dedicated clock network, which may be programmably coupled to a phase locked loop (PLL), in accordance with an embodiment of the present invention.

FIG. 21 shows a dedicated clock network 450, which may be programmably coupled to a phase locked loop (PLL) 452 which acts as a DLL, in accordance with an embodiment of the present invention. The synchronized clock input (sclk) to the PLL 452 is coupled to pad 454, while the feedback clock input (fclk) of PLL 452 receives a clock signal from vertical clock bus 456. PLL 452 is used to synchronize the signals and produces a clock signal at the output terminal of the PLL 452. The phase locked signal from PLL 452 is received by a 2:1 multiplexer 458 in each quadrant. The multiplexers 458 also receive the dedicated clock signal from dedicated clock pad 454. The select terminal of each multiplexer 458 is programmed to select the desired clock signal. Thus, each quadrant may be independently programmed to provide a phase locked clock signal or a direct clock signal to the macrocells (not shown in FIG. 21) in the quadrant. In one embodiment, a number of phase locked loop circuits may be included in the FPGA, with for example, one being multiplexed with the dedicated clock and three being connecting to the global clocks.

Figure 22:
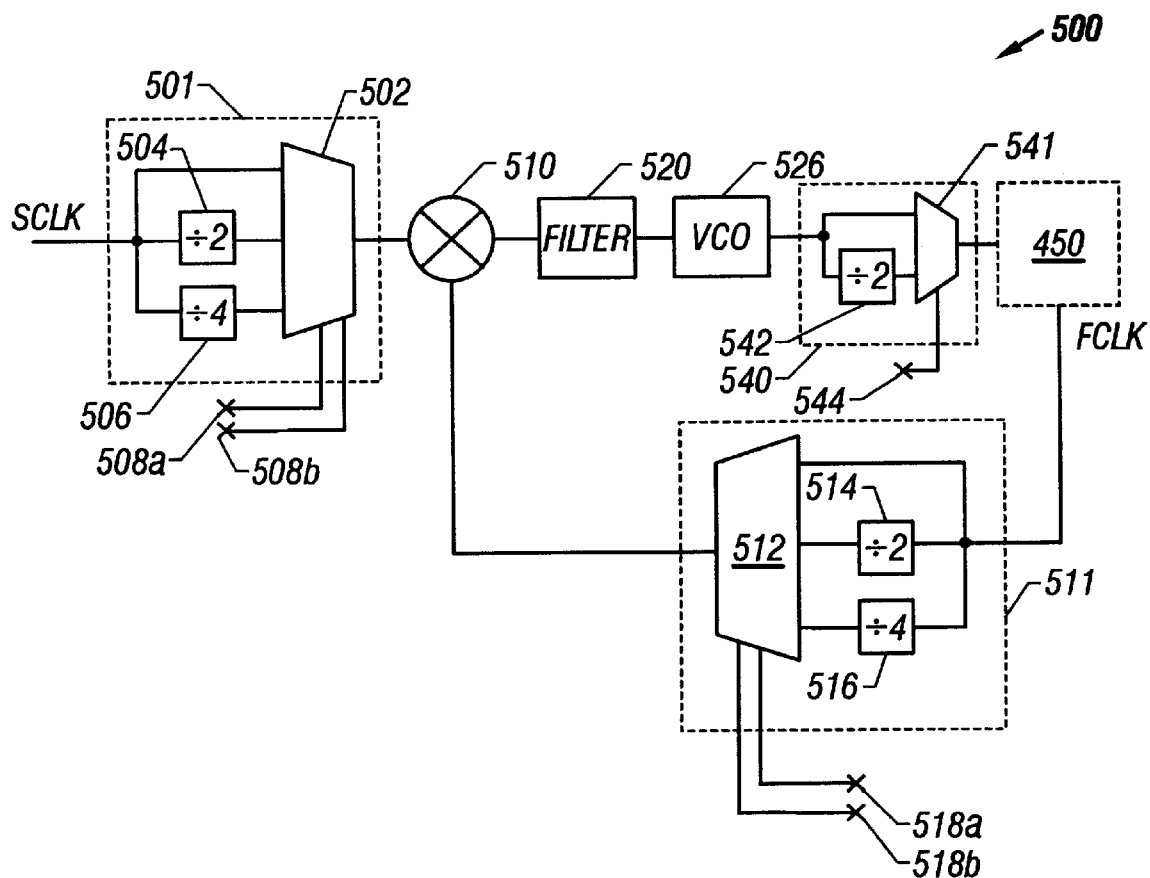
FIG. 22 shows an embodiment of a phase locked loop of FIG. 21.

FIG. 22 shows an embodiment of a phase locked loop 500 that may be used as PLL 452 in FIG. 21. As shown in FIG. 22, the synchronized clock input (sclk) is received by a programmable divide by n circuit 501, which, e.g., permits synchronized clock input (sclk) to be received by a 3:1 multiplexer 502 directly, and through a divide by 2 circuit 504 and a divide by 4 circuit 506. The select terminals of multiplexer 502 may be programmed to select the desired clock input, as indicated by antifuses 508a and 508b. It should be understood that the select terminals of multiplexer 502 may be controlled by multiplexers or registers, e.g., within logic cell 110b (FIG. 4), or a register, combinatorial logic, pin, RAM cell, etc.

The output terminal of multiplexer 502 is received by a phase detector 510, which also receives the feedback clock input (fclk) through another programmable divide by n circuit 511, which, e.g., similar to divide by n circuit 501, may include a 3:1 multiplexer 512. Similar to multiplexer 502, multiplexer 512 receives the feedback clock input signal directly as well as through a divide by 2 circuit 514 and a divide by 4 circuit 516. The select terminals of multiplexer 512 is programmable to select the desired clock input, as indicated by antifuses 518a and 518b. Again, it should be understood that the select terminals of multiplexer 512 may be controlled by multiplexers or registers, e.g., within logic cell 110b (FIG. 4), or a register, combinatorial logic, pin, RAM cell, etc. With programmable divide by n circuits 501 and 511 using, e.g., multiplexers 502 and 512, and their respective divide by 2 circuits and divide by 4 circuits, PLL 500 can multiply and divide the input frequency by 4×, 2×, 1×, 0.5× and 0.25×.

Figure 23:
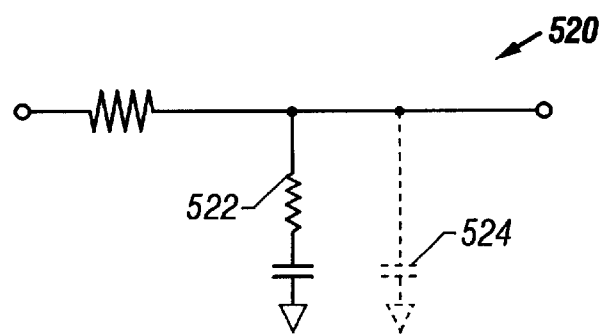
FIG. 23 shows a type 2, third order filter that may be used in the phase locked loop of FIG. 22.

Phase detector 510 provides an error signal to filter 520, which may be, e.g., type 2, third order filter, such as that shown in FIG. 23. As shown in FIG. 23, filter 520 is a low pass filter with the addition of a second resistor 522. While type 2, third order filters conventionally include a second capacitor to ground, the second capacitor 524 to ground in filter 520, is a parasitic capacitor, as indicated by broken lines.

Figure 24:
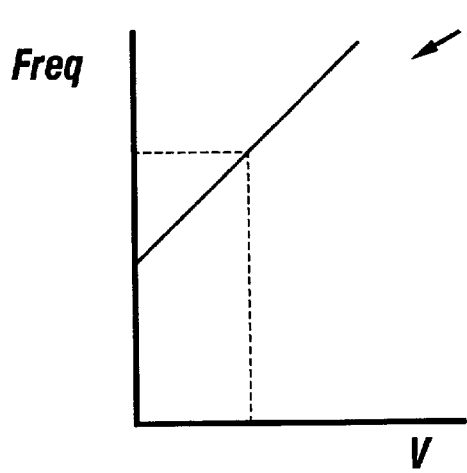
FIG. 24 is a graph of the voltage versus frequency illustrating the dynamic frequency range of the VCO in the phase locked loop of FIG. 22.

The filter 520 is coupled to a voltage controlled oscillator VCO 526. The VCO 526 is, e.g., a three stage differential VCO providing an extended range of frequencies, which advantageously, provides a wide range of options to the user of the FPGA. FIG. 24 is a graph 528 of the voltage versus frequency illustrating the dynamic range of the VCO 526. For the sake of comparison, FIG. 25 is a graph 530 of the voltage versus frequency illustrating a conventional range for a VCO. As can be seen in FIG. 25, in a conventional VCO, a large change in voltage will result in a small change in frequency. FIG. 24, on the other hand, shows that in accordance with the present invention, a large change in voltage will result in a relatively large change in frequency in VCO 526. This is particularly advantageous to provide a large frequency range.

Figure 26A:
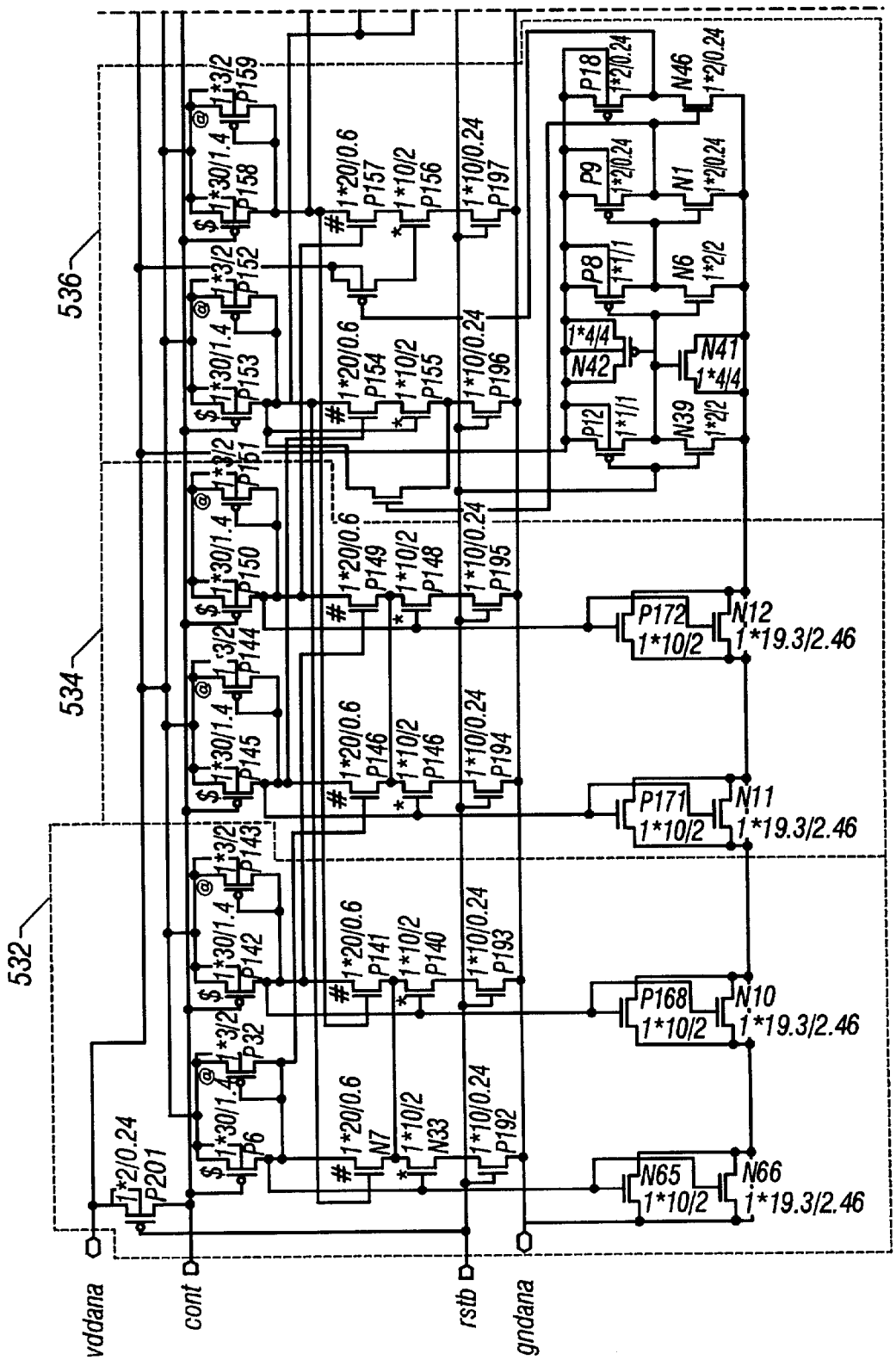
FIGS. 26A and 26B, is a schematic drawing showing an embodiment of the voltage controlled oscillator (VCO) used With the phase locked loop of FIG. 22.
Figure 26B:
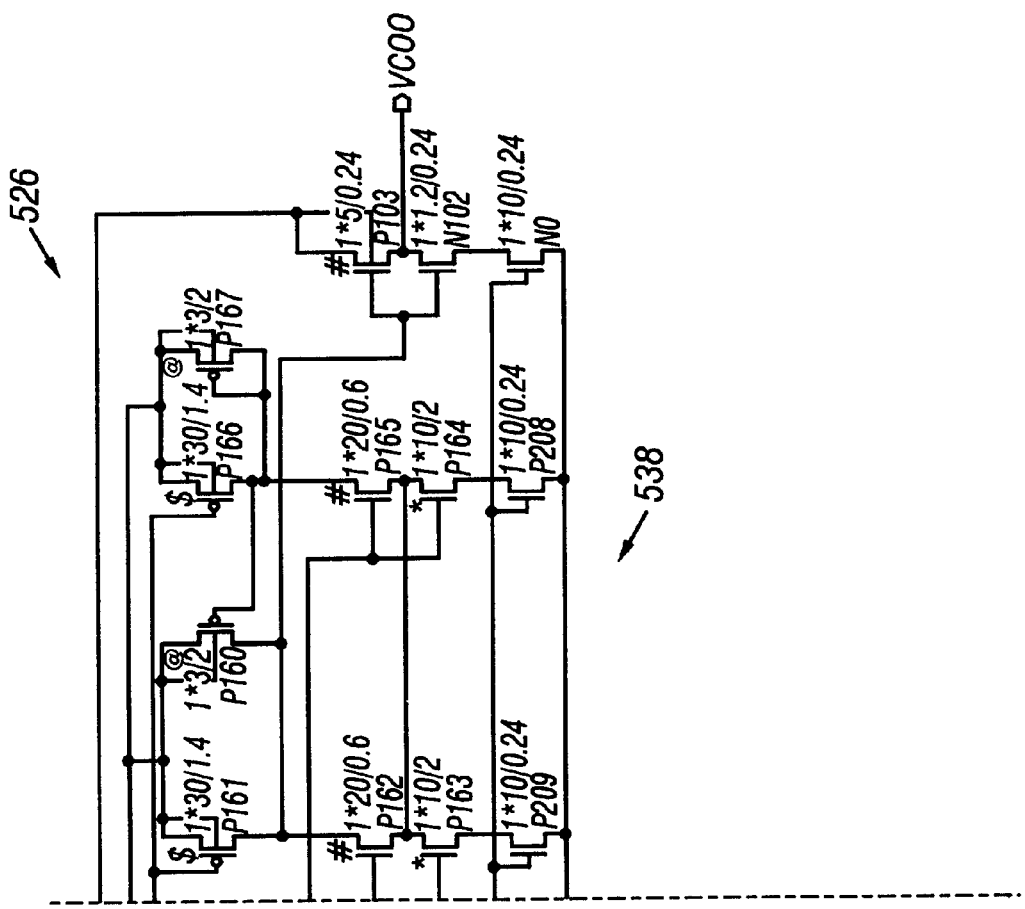

FIG. 26 is a schematic drawing showing an embodiment of VCO 526. As shown in FIG. 21, VCO 526 includes three differential stages 532, 534, and 536 and an output stage 538. The three differential stages 532, 534, and 536 are similar except for minor differences in the reset circuit in the third differential stage 536.

The output terminal of VCO 526 is received another programmable divide by n circuit 540, which e.g., may be a 2:1 multiplexer 541 that receives the output signal from VCO 526 directly and through a divide by 2 circuit 542. The select terminal of multiplexer 541 may be programmed to select the desired input as illustrated by antifuse 544. VCO 526 produces a frequency range of approximately 40 MHz to 250 MHz. With the use of divide by 2 circuit 542, the effective frequency range of VCO 526 is advantageously extended to approximately 25 MHz to 250 MHz. The output terminal of multiplexer 541 is provided to the clock distribution network 450, shown schematically in FIG. 22 as a box. The feedback clock (fclk) from the clock distribution network 450 is received by programmable divide by n circuit 511.

Figure 27:
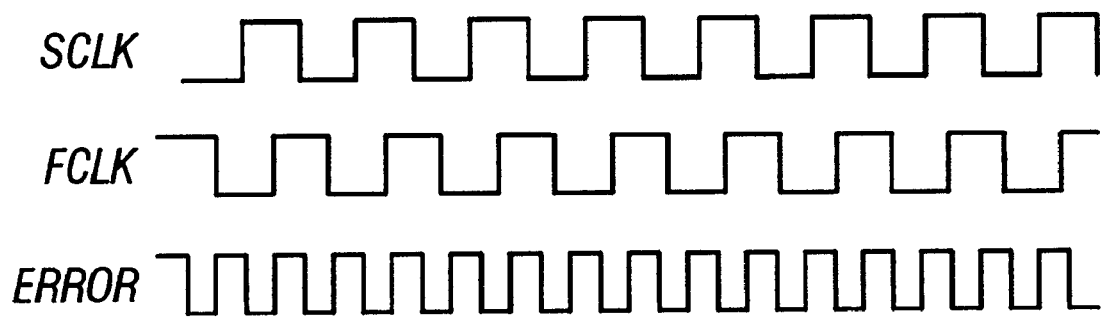
FIG. 27 shows the waveform for the synchronized clock (sclk) and the feedback clock (fclk) for the phase locked loop, as well as the error.

In one embodiment, PLL 500 attempts to maintain a 90 degree offset between the synchronized clock (sclk) and the feedback clock (fclk), as shown in FIG. 27. FIG. 27 shows the waveform for the synchronized clock (sclk) and the feedback clock (fclk) as well as the error between the two. Filter 520 will convert the error signal to an average voltage, and thus a 90 degree offset will produce a voltage that is approximately half the peak voltage. As shown in FIG. 24, it is desirable to maintain the voltage of VCO 526 in the approximate middle of the range for VCO 526 so that a large frequency variation may be accommodated.

Although the present invention is described in connection with certain specific embodiments for instructional purposes, the present invention is not limited thereto. The depictions of the various structures in the various diagrams are illustrative. Aspects of the present invention are not limited to amorphous silicon antifuses and oxide-nitride-oxide antifuses, but rather extend to other antifuse structures and programmable element structures. Further, is should be understood that conductive routing resources can be made of any suitable conductive material or combination of materials and need not be made of metal. Accordingly, various modifications, adaptations, and combinations of various features of the described embodiments can be practiced without departing from the scope of the invention as defined in the following claims.

What is claimed is:

1. A field programmable gate array, comprising:

a programmable interconnect structure; and a plurality of logic modules, each of said logic modules comprising:

a first combinatorial logic circuit having a plurality of input leads and an output lead, said input leads extending from said logic module and into said programmable interconnect structure;

a second combinatorial logic circuit having a plurality of input leads and an output lead, said input leads extending from said logic module and into said programmable interconnect structure;

a first multiplexer having a first data input lead, a second data input lead, a select input lead and an output lead, said first data input lead being connected to said output lead of said first combinatorial logic circuit within said logic module, said second data input lead being connected to said output lead of said second combinatorial logic circuit within said logic module, said output lead extending from said logic module and into said programmable interconnect structure;

a second multiplexer having a first data input lead, a second data input lead, a select input lead and an output lead, said first data input lead of said second multiplexer being connected to said output lead of said second combinatorial logic circuit within said logic module;

a first sequential logic element having a data input lead, a clock input lead, and a data output lead, said data input lead of said sequential logic element being coupled to said output lead of said first multiplexer, said data output lead extending from said logic module and into said programmable interconnect structure; and a second sequential logic element having a data input lead, a clock input lead, and a data output lead, said data input lead of said second sequential logic element being coupled to said output lead of said second multiplexer, said data output lead of said second sequential logic element extending from said logic module and into said programmable interconnect structure.

2. The field programmable gate array of claim 1, wherein said first combinatorial logic circuit has five input leads, four of said input leads extend from said logic module and into said into said programmable interconnect structure.

3. The field programmable gate array of claim 1, wherein said first combinatorial logic circuit comprises:

a first input AND gate having an output lead;

a second input AND gate having an output lead; and a third multiplexer having a first data input lead coupled to said output lead of said first two input AND gate, a second data input lead coupled to said output lead of said second two input AND gate, a select input lead and an output lead, said output lead being coupled to said data input lead of said first multiplexer.

4. The field programmable gate array of claim 3, said logic modules further comprising a fourth multiplexer having a first data input lead, a second data input lead, a select input lead and an output lead, said output lead being connected to said select input lead of said third multiplexer.

5. The field programmable gate array of claim 4, said logic modules further comprising a first six input AND gate having an output lead connected to a first data input lead of said fourth multiplexer.

6. The field programmable gate array of claim 1, said logic modules further comprising a third combinatorial logic circuit having a plurality of input leads and an output lead, said input leads extending from said logic module and into said programmable interconnect structure, said output lead being coupled to said an input lead of said first combinatorial logic circuit and an input lead of said second combinatorial logic circuit and extending from said logic module and into said programmable interconnect structure.

7. The field programmable gate array of claim 6, said logic modules further comprising a fourth combinatorial logic circuit having a plurality of input leads and an output lead, said input leads extending from said logic module and into said programmable interconnect structure, said output lead being coupled to said select input lead of said first multiplexer and extending from said logic module and into said programmable interconnect structure.

8. The field programmable gate array of claim 7, wherein said third combinatorial logic circuit is a first six input AND gate and said fourth combinatorial logic circuit is a second six input AND gate.

9. The field programmable gate array of claim 8, wherein at least one input lead of said first six input AND gate and at least one input lead of said second six input AND gate are programmable coupled to a clock bus in said programmable interconnect structure.

10. The field programmable gate array of claim 1, wherein said second data input lead and said select input lead of said second multiplexer extend from said logic module and into said into said programmable interconnect structure.

11. A logic cell for a programmable application specific integrated circuit, said logic cell comprising:

a combinatorial logic circuit having a plurality of input leads and an output lead;

a first sequential logic element having a data input lead, a clock input lead, and a data output lead, said data input lead of said first sequential logic element being selectively coupled to said output lead of said combinatorial logic circuit, said data output lead of said first sequential logic element extending from said logic module and into said programmable interconnect structure; and a second sequential logic element having a data input lead, a clock input lead, and a data output lead, said data input lead of said second sequential logic element being selectively coupled to said output lead of said combinatorial logic circuit, said data output lead of said second sequential logic element extending from said logic module and into said programmable interconnect structure.

12. The logic cell of claim 11, further comprising:

a first means for selectively coupling said output lead of said combinatorial logic circuit to said data input lead of said first sequential logic element; and a second means for selectively coupling said output lead of said combinatorial logic circuit to said data input lead of said second sequential logic element.

13. The logic cell of claim 12, wherein said first means is a first multiplexer and said second means is a second multiplexer.

14. A programmable device, comprising:

a programmable interconnect structure; and a plurality of logic modules, each of said logic modules having at least one output lead and a driver coupled between at least one output lead and said programmable interconnect structure, said driver comprising:

an inverter having an input lead and an output lead, said input lead of said inverter coupled to said output lead of said logic module, a protection transistor having a first terminal, a second terminal and a gate terminal, said first terminal coupled to said output lead of said inverter, said second terminal coupled to said programmable interconnect structure;

a primary charge pump coupled to said gate; and a secondary charge pump coupled to said primary charge pump and to said gate terminal of said protection transistor.

15. The programmable device of claim 14, wherein there are no transistors disposed between said protection transistor and said inverter, and there are no transistors disposed between said protection transistor and said programmable interconnect structure.

16. A programmable device comprising:

an array of logic cells;

a programmable interconnect structure coupled to said logic cells;

an I/O circuit comprising:

an I/O pad; and an output register having an input terminal coupled to said programmable interconnect structure and an output terminal coupled to said I/O pad and said programmable interconnect structure, wherein said I/O circuit further comprises:

a multiplexer having a first data terminal coupled to said output terminal of said output register and a second data terminal coupled directly to said input terminal of said output register, and an output terminal coupled to said I/O pad.

17. A programmable device comprising:

an array of logic cells;

a programmable interconnect structure coupled to said logic cells;

an I/O circuit comprising:

an I/O pad; and an output register having an input terminal coupled to said programmable interconnect structure and an output terminal coupled to said I/O pad and said programmable interconnect structure, wherein said I/O circuit further comprises:

a buffer having an input terminal coupled to said output terminal of said output register and an output terminal coupled to said I/O pad, said buffer having an enable terminal; and an output enable register having an input terminal coupled directly to said programmable interconnect structure and an output terminal coupled to said enable terminal of said buffer.

18. The programmable device of claim 17, wherein said I/O circuit further comprises:

a multiplexer having a first data terminal coupled to said output terminal of said output enable register, a second data terminal coupled to said input terminal of said output enable register, and an output terminal coupled to said input terminal of said buffer.

19. A programmable device comprising:

an array of logic cells;

a programmable interconnect structure coupled to said logic cells;

an I/O circuit comprising:

an I/O pad; and an output register having an input terminal coupled to said programmable interconnect structure and an output terminal coupled to said I/O pad and said programmable interconnect structure, wherein said I/O circuit further comprises a buffer with an adjustable slew rate, said buffer comprising an input terminal coupled to said output terminal of said output register and an output terminal coupled to said I/O pad and a slew rate control terminal coupled to said programmable interconnect structure.

20. The programmable device of claim 19, wherein said buffer comprises:

at least one inverter having an input terminal coupled to said output terminal of said output register and an output terminal coupled to said I/O pad, said inverter coupled to a voltage source and to ground potential through a resistive element;

a logic gate having an input terminal coupled to said slew rate control terminal, and an output terminal; and a first transistor disposed between said at least one inverter and said ground potential in parallel with said resistive element, said first transistor having a gate coupled to said output terminal of said logic gate, said first transistor having less resistance than said resistive element.

21. The programmable device of claim 20, wherein said buffer further comprises:

a second inverter having an input terminal coupled to said output terminal of said output register and an output terminal coupled to said I/O pad, said second inverter coupled to a voltage source through a second resistive element and to ground potential; and a second transistor disposed between said second inverter and said voltage source in parallel with said second resistive element, said second transistor having a gate coupled to said output terminal of said logic gate, said second transistor having less resistance than said second resistive element.

22. The programmable device of claim 21, wherein said resistive element is a third transistor that is smaller than said first transistor and said second resistive element is a fourth transistor smaller than said second transistor, wherein said third transistor and said fourth transistor enable and disable said buffer.

23. A programmable device comprising:

an array of logic cells;

a programmable interconnect structure coupled to said logic cells;

an I/O circuit comprising:

an I/O pad;

an input register having an input terminal coupled to said I/O pad and an output terminal coupled to said programmable interconnect structure;

an output register having an input terminal coupled to said programmable interconnect structure and an output terminal coupled to said I/O pad; and a buffer disposed between said output terminal of said output register and said I/O pad, said buffer having an input terminal coupled to said output terminal of said output register and an output terminal coupled to said I/O pad, said buffer having an enable terminal; and an output enable register having an input terminal coupled to said programmable interconnect structure and an output terminal coupled to said enable terminal of said buffer.

24. The programmable device of claim 23, wherein said output terminal of said output register is also coupled to said programmable interconnect structure.

25. The programmable device of claim 23, wherein said I/O circuit further comprises a buffer with an adjustable slew rate, said buffer comprising an input terminal coupled to said output terminal of said output register and an output terminal coupled to said I/O pad and a slew rate control terminal coupled to said programmable interconnect structure.

26. The programmable device of claim 25, wherein said buffer comprises:

at least one inverter having an input terminal coupled to said output terminal of said output register and an output terminal coupled to said I/O pad, said inverter coupled to a voltage source and to ground potential through a resistive element;

a logic gate having an input terminal coupled to said slew rate control terminal, and an output terminal; and a first transistor disposed between said at least one inverter and said ground potential in parallel with said resistive element, said first transistor having a gate coupled to said output terminal of said logic gate, said first transistor having less resistance than said resistive element.

27. The programmable device of claim 26, wherein said buffer further comprises:

a second inverter having an input terminal coupled to said output terminal of said output register and an output terminal coupled to said I/O pad, said second inverter coupled to a voltage source through a second resistive element and to ground potential; and a second transistor disposed between said second inverter and said voltage source in parallel with said second resistive element, said second transistor having a gate coupled to said output terminal of said logic gate, said second transistor having less resistance than said second resistive element.

28. The programmable device of claim 27, wherein said resistive element is a third transistor that is smaller than said first transistor and said second resistive element is a fourth transistor smaller than said second transistor.

29. The programmable device of claim 23, said programmable device further comprising a boundary scan circuit, said boundary scan circuit using said input register, said output register and said output enable register of said I/O circuit.

30. The programmable device of claim 23, wherein said input register has an enable terminal, said output enable register has an enable terminal, said programmable device further comprising:

at least one I/O control pad programmably coupled to said enable terminal of said input register and programmably coupled to said enable terminal of said output enable register.

31. The programmable device of claim 30, wherein said input register has a reset terminal, said output enable register has a reset terminal and said output register has a reset terminal, said at least one I/O control pad being programmably coupled to said reset terminals of said input register, said output enable register and said output register.

32. The programmable device of claim 30, wherein said input register has a clock terminal, said output enable register has a clock terminal and said output register has a clock terminal, said at least one I/O control pad being programmably coupled to said clock terminals of said input register, said output enable register and said output register.

33. The programmable device of claim 30, further comprising:

a hardwired clock bus;

a multiplexer having a first data terminal programmably coupled to said at least one I/O control pad and a second data terminal programmably coupled to said hardwired clock bus, and an output terminal coupled to said clock terminals of said input register, said output register and said output enable register.

34. The programmable device of claim 30, said at least one I/O control pad being programmably coupled to said input terminal of said output enable register.

35. A programmable device comprising:

an array of logic cells;

a programmable interconnect structure coupled to said logic cells;

an I/O circuit comprising:

an I/O pad;

an output register having an input terminal coupled to said programmable interconnect structure and an output terminal; and a buffer with an adjustable slew rate, said buffer comprising an input terminal coupled to said output terminal of said output register and an output terminal coupled to said I/O pad and a slew rate control terminal coupled to said programmable interconnect structure.

36. The programmable device of claim 35, wherein said buffer comprises:

at least one inverter having an input terminal coupled to said output terminal of said output register and an output terminal coupled to said I/O pad, said inverter coupled to a voltage source and to ground potential through a resistive element;

a logic gate having an input terminal coupled to said slew rate control terminal, and an output terminal; and a first transistor disposed between said at least one inverter and said ground potential in parallel with said resistive element, said first transistor having a gate coupled to said output terminal of said logic gate, said first transistor having less resistance than said resistive element.

37. The programmable device of claim 36, wherein said buffer further comprises:

a second inverter having an input terminal coupled to said output terminal of said output register and an output terminal coupled to said I/O pad, said second inverter coupled to a voltage source through a second resistive element and to ground potential; and a second transistor disposed between said second inverter and said voltage source in parallel with said second resistive element, said second transistor having a gate coupled to said output terminal of said logic gate, said second transistor having less resistance than said second resistive element.

38. The programmable device of claim 37, wherein said resistive element is a third transistor that is smaller than said first transistor and said second resistive element is a fourth transistor smaller than said second transistor, wherein said third transistor and said fourth transistor enable and disable said buffer.

39. A programmable device comprising:
an array of logic cells;
a programmable interconnect structure coupled to said logic cells;
an I/O circuit comprising:
  an I/O pad;
  an input register having an input terminal and an output terminal coupled to said programmable interconnect structure;
  a multiplexer having a first data terminal coupled to said I/O pad, a second data terminal, and an output terminal coupled to said input terminal of said input register; and
  a differential translator having a first input terminal coupled to said I/O pad, a second input terminal coupled to a voltage reference source, and an output terminal coupled to said second data terminal of said multiplexer.

40. The programmable device of claim 39, wherein said second input terminal of said differential translator may be programmably coupled to at least two voltage reference sources.

41. The programmable device of claim 40, wherein said I/O circuit is programmably coupled to a plurality of voltage sources.

42. The programmable device of claim 40, wherein said multiplexer has a select terminal coupled to said programmable interconnect structure.

43. The programmable device of claim 39, wherein said output terminal of said multiplexer is also coupled to said programmable interconnect structure.

44. A field programmable gate array, comprising:
an array of logic cells divided into quadrants;
a clock pad; and
a clock network coupled to said clock pad, said clock network having clock buses extending into the approximate center of each quadrant and bisecting each quadrant of said array of logic cells.

45. The field programmable gate array of claim 44, wherein said clock network comprises:
a primary clock bus coupled to said clock pad and extending in a horizontal direction between said quadrants;
a plurality of second clock buses each of which is coupled to said primary clock bus and extends in a vertical direction to the approximate center of a quadrant;
a plurality of third clock buses each of which is located in a quadrant and is coupled to one of said plurality of second clock buses and extends in a horizontal direction bisecting said quadrant; and
a plurality of fourth clock buses coupled to each of said third clock buses, wherein a first portion of fourth clock buses vertically extend from said third clock buses in a first direction, and a second portion of fourth clock buses vertically extend from said third clock buses in a second direction opposite said first direction.

46. The field programmable gate array of claim 45, wherein each bus in said first portion of fourth clock buses may be programmably coupled to a first plurality of logic cells, and each bus in said second portion of fourth clock buses may be programmably coupled to a second plurality of logic cells.

47. The field programmable gate array of claim 46, wherein said first plurality of logic cells and said second plurality of logic cells has the same number of logic cells.

48. The field programmable gate array of claim 45, wherein each of said second clock buses is coupled to a third clock bus at the approximate center of said third clock bus.

49. The field programmable gate array of claim 45, further comprising a fifth clock bus extending from said clock pad to said primary clock bus, said fifth clock bus being coupled to the approximate center of said primary clock bus.

50. The field programmable gate array of claim 44, further comprising:
a phase locked loop circuit having an input terminal coupled to said primary clock bus, a feedback terminal coupled to one of said fourth clock buses, and an output terminal coupled a second primary clock bus that is parallel to said primary clock bus;
a second plurality of second clock buses each of which is coupled to said second primary clock bus and is parallel with one of said plurality of second clock buses; and
a plurality of multiplexers, each multiplexer having a first data terminal receiving one of said plurality of second clock buses, a second data terminal receiving one of said second plurality of second clock buses, and an output terminal coupled to one of said plurality of third clock buses.

51. The field programmable gate array of claim 50, wherein said phase locked loop circuit comprises:
a first programmable divide by n circuit having an input terminal coupled to said primary clock bus and an output terminal;
a phase detector having a first input terminal coupled to said output terminal of said first programmable divide by n circuit, a second input terminal and an output terminal;
a low pass filter having an input terminal coupled to said output terminal of said phase detector and an output terminal;
a voltage controlled oscillator having an input terminal coupled to said output terminal of said low pass filter and an output terminal;
a second programmable divide by n circuit having an input terminal coupled to said output terminal of said voltage controlled oscillator, and an output terminal coupled to said second primary clock bus that is parallel to said primary clock bus; and
a third programmable divide by n circuit having an feedback terminal coupled to said one of said fourth clock buses and an output terminal coupled to said second input terminal of said phase detector.

52. The field programmable gate array of claim 51, wherein said first programmable divide by n circuit comprises:
a multiplexer having a first data terminal, a second data terminal, a third data terminal, and an output terminal coupled to said first input terminal of said phase detector, said first data terminal being coupled to said primary clock bus;
a divide by 2 circuit, said second data terminal being coupled to said primary clock bus through said divide by 2 circuit; and
a divide by 4 circuit, said third data terminal being coupled to said primary clock bus through said divide by 4 circuit.

53. The field programmable gate array of claim 52, wherein said third programmable divide by n circuit comprises:
a second multiplexer having a first data terminal, a second data terminal, a third data terminal, and an output terminal coupled to said second input terminal of said phase detector, said first data terminal being coupled to said one of said fourth clock buses;
a second divide by 2 circuit, said second data terminal being coupled to said one of said fourth clock buses through said second divide by 2 circuit; and
a second divide by 4 circuit, said third data terminal being coupled to said one of said fourth clock buses through said divide by 4 circuit.

54. The field programmable gate array of claim 51, wherein said second programmable divide by n circuit comprises:
a multiplexer having a first data terminal, a second data terminal, and an output terminal coupled to said second primary clock bus that is parallel to said primary clock bus, said first data terminal being coupled to said output terminal of said voltage controlled oscillator; and
a divide by 2 circuit, said second data terminal being coupled to said voltage controlled oscillator through said divide by 2 circuit.

55. The field programmable gate array of claim 44, wherein said clock pad is a dedicated clock pad, and said clock network provides a dedicated clock signal to each quadrant.

56. A field programmable gate array, comprising:
an array of logic cells;
a clock network programmably coupled to said logic cells, said clock network providing a clock signal to selected logic cells;
a phase locked loop circuit coupled to said clock network, said phase locked loop circuit comprising:
a first programmable divide by n circuit receiving said clock signal having an input terminal coupled to said clock network, and having an output terminal;
a phase detector having a first input terminal coupled to said output terminal of said first programmable divide by n circuit, and having a second input terminal and an output terminal;
a low pass filter having an input terminal coupled to said output terminal of said phase detector and having an output terminal;
a voltage controlled oscillator having an input terminal coupled to said output terminal of said low pass filter and having an output terminal;
a second programmable divide by n circuit having an input terminal coupled to said output terminal of said voltage controlled oscillator, and having an output terminal coupled to said clock network; and
a third programmable divide by n circuit having an feedback terminal coupled to said clock network and having an output terminal coupled to said second input terminal of said phase detector.

57. The field programmable gate array of claim 56, wherein said first programmable divide by n circuit comprises:
a multiplexer having a first data terminal, a second data terminal, a third data terminal, and an output terminal coupled to said first input terminal of said phase detector, said first data terminal being coupled to said clock network;
a divide by 2 circuit, said second data terminal being coupled to said clock network through said divide by 2 circuit; and
a divide by 4 circuit, said third data terminal being coupled to said clock network through said divide by 4 circuit.

58. The field programmable gate array of claim 56, wherein said third programmable divide by n circuit comprises:
a second multiplexer having a first data terminal, a second data terminal, a third data terminal, and an output terminal coupled to said second input terminal of said phase detector, said first data terminal being coupled to said clock network;
a second divide by 2 circuit, said second data terminal being coupled to said clock network through said second divide by 2 circuit; and
a second divide by 4 circuit, said third data terminal being coupled to said clock network through said divide by 4 circuit.

59. The field programmable gate array of claim 56, wherein said second programmable divide by n circuit comprises:
a multiplexer having a first data terminal, a second data terminal, and an output terminal coupled to said second clock network, said first data terminal being coupled to said output terminal of said voltage controlled oscillator; and
a divide by 2 circuit, said second data terminal being coupled to said voltage controlled oscillator through said divide by 2 circuit.

60. A field programmable gate array comprising:
an array of logic cells;
routing resources having antifuses programming coupling said logic cells, wherein said array of logic cells and routing resources are divided into at least a first subsection and a second subsection;
a plurality of horizontal programming cells coupled to each subsection, wherein a first set of horizontal programming cells is coupled to said first subsection and a second set of horizontal programming cells is coupled to said second subsection;
a plurality of vertical programming cells, wherein a first set of vertical programming cells is coupled to said first subsection and a second set of vertical programming cells is coupled to said second subsection;
a plurality of power buses, a first set of power buses coupled to said first set of horizontal programming cells, a second set of power buses coupled to said second set of horizontal programming cells, a third set of power buses coupled to said first set of vertical programming cells, and a fourth set of power buses coupled to said second set of vertical programming cells.

61. The field programmable gate array of claim 60, wherein:
said first set of horizontal programming cells approximately bisects said first subsection and wherein a first subset of said first set of power buses is used to program antifuses in a first direction and a second subset of said first set of power buses is used to program antifuses in a second direction opposite said first direction; and
said first set of vertical programming cells approximately bisects said first subsection and wherein a first subset of said third set of power buses is used to program antifuses in a third direction orthogonal to said first direction and a second subset of said third set of power buses is used to program antifuses in a fourth direction opposite said third direction.

62. The field programmable gate array of claim 60, wherein there are a eight power buses and there are four power buses in said first set of power buses and four power buses in said second set of power buses, wherein said first set of power buses and said second set of power buses comprises at least one different power bus.

63. The field programmable gate array of claim 62, wherein there are four power buses in said third set of power buses and four power buses in said fourth set of power buses, wherein said third set of power buses and said fourth set of power buses comprises at least three different power buses.

64. The field programmable gate array of claim 63, wherein said first set of power buses and said third set of power buses comprises at least one different power bus, and said second set of power buses and said fourth set of power buses comprises at least one different power bus.

65. The field programmable gate array of claim 62, further comprising:
  a third subsection and a fourth subsection of said array of logic cells and routing resources;
  a third set of horizontal programming cells coupled to said third subsection and a fourth set of horizontal programming cells coupled to said fourth subsection;
  a third set of vertical programming cells coupled to said third subsection and a fourth set of vertical programming cells coupled to said fourth subsection; and
  a fifth set of power buses coupled to said third set of horizontal programming cells, a sixth set of power buses coupled to said fourth set of horizontal programming cells, a seventh set of power buses coupled to said third set of vertical programming cells, and an eighth set of power buses coupled to said fourth set of vertical programming cells.

66. The field programmable gate array of claim 65, wherein each set of horizontal programming cells and vertical programming cells approximately bisects a subsection of logic cells and routing resources.

67. A field programmable gate array comprising:
  an array of logic cells divided into quadrants;
  a set of horizontal programming cells coupled to and bisecting each quadrant;
  a set of vertical programming cells coupled to and bisecting each quadrant, such that a pair of horizontal programming cells and vertical programming cells subdivides each quadrant into subquadrants; and
  a plurality of power buses, wherein each set of horizontal programming cells and each set of vertical programming cells is coupled to a different set of power buses.

68. The field programmable gate array of claim 67, wherein there are eight power buses and each set of horizontal programming cells and each set of vertical programming cells is coupled to a different set of four power buses.

69. The field programmable gate array of claim 68, wherein each set of horizontal programming cells is coupled to a different set of power buses containing at least one different power bus.

70. The field programmable gate array of claim 68, wherein each set of vertical programming cells is coupled to a different set of power buses containing at least one different power bus.

71. The field programmable gate array of claim 68, wherein each set of horizontal programming cells provides a first subset of power buses in a first direction and a second subset of power buses in a second direction opposite said first direction.

72. The field programmable gate array of claim 71, wherein said first subset comprises two power buses and said second subset comprises a different two power buses.

73. The field programmable gate array of claim 71, wherein each set of vertical programming cells provides a third subset of power buses in a third direction orthogonal to said first direction and a fourth subset of power buses in a fourth direction opposite said third direction.

74. The field programmable gate array of claim 73, wherein said third subset comprises two power buses and said fourth subset comprises a different two power buses.

75. A programmable device comprising:
  at least one antifuse;
  a high voltage programming source switchably coupled to said antifuse;
  a low voltage programming source switchably coupled to said antifuse;
  a first NMOS transistor disposed between said high voltage programming source and said antifuse;
  a first PMOS transistor disposed between said high voltage programming source and said antifuse, said first PMOS transistor being in parallel with said first NMOS transistor; and
  a control circuit coupled to said first NMOS transistor and said first PMOS transistor, said control circuit switching said first NMOS transistor and said first PMOS transistor on and off substantially simultaneously.

76. The programmable device of claim 70, further comprising:
  a second NMOS transistor disposed between said low voltage programming source and said antifuse;
  a second PMOS transistor disposed between said low voltage programming source and said antifuse, said second PMOS transistor being in parallel with said second NMOS transistor; and
  said control circuit is coupled to said second NMOS transistor and said second PMOS transistor, said control circuit switching said second NMOS transistor and said second PMOS transistor on and off substantially simultaneously.

77. The programmable device of claim 70, wherein said control circuit provides a gate voltage at said first NMOS transistor that is approximately equal to the voltage provided by said high voltage programming source.

78. The programmable device of claim 70, further comprising a plurality of NMOS transistors disposed in series between said high voltage programming source and said antifuse and a plurality of PMOS transistors, each of which is in parallel with a corresponding NMOS transistor.

79. The programmable device of claim 70, further comprising a plurality of NMOS transistors disposed in series between said low voltage programming source and said antifuse and a plurality of PMOS transistors, each of which is in parallel with a corresponding NMOS transistor.

80. A method of programming an antifuse in a programmable device, said method comprising:
  switchably coupling said antifuse to a high voltage programming source through a first N channel transistor;
  switchably coupling said antifuse to said high voltage programming source through a first P channel transistor in parallel with said first N channel transistor;
  switchably coupling said antifuse to a low voltage programming source through a second N channel transistor; and
  switchably coupling said antifuse to said low voltage programming source through a second P channel transistor in parallel with said first N channel transistor.

81. The method of claim 80, further comprising:
  switchably coupling said antifuse to said high voltage programming source through a first plurality of serial N channel transistors;

switchably coupling said antifuse to said high voltage programming source through a first plurality of serial P channel transistor, each of said serial P channel transistors being in parallel with one of said first plurality of serial N channel transistors;

switchably coupling said antifuse to said low voltage programming source through a second plurality of serial N channel transistors; and switchably coupling said antifuse to said low voltage programming source through a second plurality of serial P channel transistor, each of said second plurality of serial P channel transistors being in parallel with one of said second plurality of serial N channel transistors.

82. The method of claim 80, further comprising:

switchably coupling said antifuse to said low voltage programming source through a third N channel transistor that is in series with said second plurality of serial N channel transistors.

83. The method of claim 82, wherein there are three N channel transistors in said first plurality of serial N channel transistors, three P channel transistors in said first plurality of serial P channel transistors, two N channel transistors in said second plurality of serial N channel transistors, and two P channel transistors in said second plurality of serial P channel transistors.

84. A programmable device comprising:

an array of logic cells;

a programmable interconnect structure coupled to said logic cells;

an I/O circuit;

at least one I/O control pad; and a multiplexer having a first data terminal coupled to said at least one I/O control pad, a second data terminal coupled to said programmable interconnect structure, and an output terminal coupled to said I/O circuit and said programmable interconnect structure.

85. The programmable device of claim 84, wherein said I/O circuit comprises:

an I/O pad;

an input register having an input terminal coupled to said I/O pad, an enable terminal coupled to said I/O control pad, and an output terminal coupled to said programmable interconnect structure;

an output register having an input terminal coupled to said programmable interconnect structure and an output terminal coupled to said I/O pad; and a buffer disposed between said output terminal of said output register and said I/O pad, said buffer having an input terminal coupled to said output terminal of said output register and an output terminal coupled to said I/O pad, said buffer having an enable terminal; and an output enable register having an input terminal coupled to said programmable interconnect structure, an enable terminal coupled to said I/O control pad, and an output terminal coupled to said enable terminal of said buffer.

* * * * *